United States Patent
Wu et al.

(10) Patent No.: US 12,298,536 B2
(45) Date of Patent: May 13, 2025

(54) HEAD-UP DISPLAY SYSTEM, ACTIVE LIGHT-EMITTING IMAGE SOURCE, HEAD-UP DISPLAY AND MOTOR VEHICLE

(71) Applicant: FUTURUS TECHNOLOGY CO., LTD., Beijing (CN)

(72) Inventors: Huijun Wu, Beijing (CN); Junfeng Xu, Beijing (CN); Tao Fang, Beijing (CN)

(73) Assignee: FUTURUS TECHNOLOGY CO., LTD., Beijing (CN)

( * ) Notice: Subject to any disclaimer, the term of this patent is extended or adjusted under 35 U.S.C. 154(b) by 480 days.

(21) Appl. No.: 17/611,993

(22) PCT Filed: May 15, 2020

(86) PCT No.: PCT/CN2020/090610
§ 371 (c)(1),
(2) Date: Nov. 17, 2021

(87) PCT Pub. No.: WO2020/233529
PCT Pub. Date: Nov. 26, 2020

(65) Prior Publication Data
US 2022/0252899 A1      Aug. 11, 2022

(30) Foreign Application Priority Data

May 17, 2019   (CN) .......................... 201910412213.8
Apr. 22, 2020  (CN) .......................... 202010321007.9

(51) Int. Cl.
G02B 30/29     (2020.01)
G02B 27/01     (2006.01)
H01L 25/075    (2006.01)

(52) U.S. Cl.
CPC ......... *G02B 30/29* (2020.01); *G02B 27/0101* (2013.01); *G02B 2027/0134* (2013.01); *H01L 25/0753* (2013.01)

(58) Field of Classification Search
CPC ........ G02B 30/29; G02B 30/27; G02B 30/28; G02B 30/30; G02B 30/33; G02B 27/0172;
(Continued)

(56) References Cited

U.S. PATENT DOCUMENTS 5,379,132 A *  1/1995 Kuwayama ........ G02B 27/0103
                                                  359/13
6,680,800 B1 * 1/2004 Schreiber ........... G02B 19/0052
                                                  359/623
(Continued)

FOREIGN PATENT DOCUMENTS

CN    207817313 U    9/2018
CN    108983423 A   12/2018
(Continued)

*Primary Examiner* — Jyotsna V Dabbi
(74) *Attorney, Agent, or Firm* — Dilworth & Barrese, LLP.; Michael J. Musella, Esq.

(57) ABSTRACT

A head-up display system, an active light-emitting image source, a head-up display and a motor vehicle. The head-up display system includes a plurality of light sources arranged according to a predetermined rule; a micro-lens array including a plurality of micro-lenses, wherein each micro-lens corresponds to one or more light sources and adjusts directions of chief light of light emitted by the one or more light sources corresponding thereto, and the micro-lens array converges chief light of light emitted by the plurality of light sources so that chief light of light after being exited from the micro-lens array is directed to a predetermined range; and a reflector device for displaying at a side, away from the light sources, of the micro-lens array, and configured to emit light to an observation region.

14 Claims, 21 Drawing Sheets

(58) Field of Classification Search
CPC .............. G02B 27/0101; G02B 27/017; G02B 27/014; G02B 27/01; G02B 27/0961; G02B 27/0955; G02B 27/0966; G02B 27/02; G02B 27/106; G02B 27/30; G02B 2027/0178; G02B 2027/0118; G02B 2027/0134; G02B 2027/013; G02B 3/0006; G02B 3/005; G02B 3/0037; G02B 3/0062; G02B 3/0056; G02B 3/0075; G02B 5/02; G02B 5/201; G02B 5/18; G02B 6/003; G02B 6/0051; G02B 3/06; G02B 3/08; G02B 2003/0093; H01L 25/0753; H01L 25/0756; H04N 13/229; H04N 13/302; H04N 13/305; H04N 13/31; G02F 1/133605; G02F 1/133606; G02F 1/133611; G02F 1/133607

USPC ......................................................... 359/463
See application file for complete search history.

(56) References Cited

U.S. PATENT DOCUMENTS

| 2008/0204731 | A1 | | 8/2008 | Williams | |
|---|---|---|---|---|---|
| 2016/0282617 | A1 | | 9/2016 | Asai | |
| 2019/0121128 | A1 | * | 4/2019 | Kasahara | ........... G02B 27/0149 |
| 2020/0174279 | A1 | * | 6/2020 | Ishihara | ................. B60K 35/00 |

FOREIGN PATENT DOCUMENTS

| JP | H3-113412 A | | 5/1991 | |
|---|---|---|---|---|
| JP | 2014-174494 A | | 9/2014 | |
| JP | 2018-185437 A | | 11/2018 | |
| WO | WO-2017183556 A1 | * | 10/2017 | ............. B60K 35/00 |
| WO | WO-2019212636 A1 | * | 11/2019 | ............. B60K 35/00 |

* cited by examiner

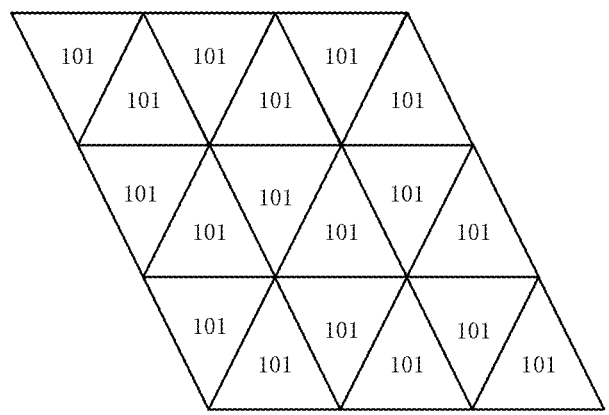
FIG. 12A
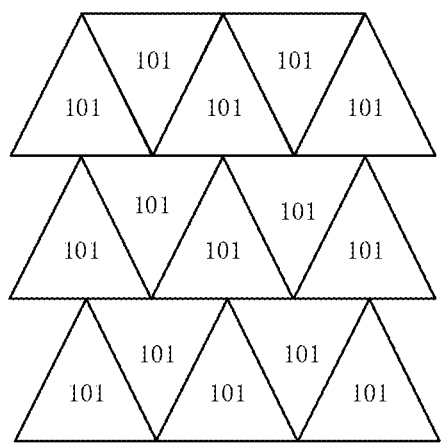
FIG. 12B
FIG. 13A

HEAD-UP DISPLAY SYSTEM, ACTIVE LIGHT-EMITTING IMAGE SOURCE, HEAD-UP DISPLAY AND MOTOR VEHICLE

The present application claims priority of Chinese Patent Application No. 201910412213.8 filed on May 17, 2019, and Chinese Patent Application No. 202010321007.9 filed on Apr. 22, 2020, the disclosure of which are incorporated herein by reference in their entirety as part of the present application, for all purposes.

TECHNICAL FIELD

The present disclosure relates to a head-up display system, an active light-emitting image source, a head-up display and a motor vehicle.

BACKGROUND

HUD (head-up display) is a kind of reflective optical design, which finally projects light emitted by an image source onto a displaying window (a displaying panel, a windshield, etc.), so that a driver can directly see a picture without looking down, thereby avoiding a distraction caused by the driver looking down at a dashboard during driving, improving a driving safety factor and bringing a better driving experience.

At present, an HUD image displayed through the displaying window has poor brightness, and it is often difficult to see the HUD image clearly under strong light such as direct sunlight. In order to ensure the brightness of HUD image displayed on the windshield, it is necessary to improve the brightness of HUD image source. Traditional HUD design basically uses liquid crystal display (LCD) as the image source, but the LCD image source has a low utilization rate of light from a light source. As a result, the solution of ensuring the brightness of HUD display and imaging by improving the brightness of the image source may increase a power consumption of the image source, and hence may lead to problems such as increased power consumption and larger heat generation, all of which may limit the further popularization and application of HUD. Therefore, there is an urgent need for an HUD design that can achieve high-brightness screen display with less power consumption.

SUMMARY

According to at least one embodiment of the present disclosure, a head-up display system is provided. The head-up display system includes: a plurality of light sources arranged according to a predetermined rule; a micro-lens array including a plurality of micro-lenses, wherein each micro-lens of the plurality of micro-lenses corresponds to one or more light sources and is configured to adjust a direction of chief light (optical axis) of light emitted by the one or more light sources corresponding to the each micro-lens, and the micro-lens array is configured to concentrate chief light of light emitted by the plurality of light sources so that chief light of light after being exited from the micro-lens array is directed to a predetermined range; and a reflector device for displaying arranged at a side, away from the plurality of light sources, of the micro-lens array, wherein the light emitted by the plurality of light sources is incident on the reflector device for displaying after passing through the micro-lens array and is reflected on a surface of the reflector device for displaying, and then reflected light is incident into an observation region.

In some examples, at least part of the plurality of light sources are configured to be independently controlled to emit light so as to form image light.

In some examples, an area of the predetermined range is smaller than an area of the observation region.

In some examples, the predetermined rule includes that, the plurality of light sources are arranged along a first direction and a second direction, and the first direction is different from the second direction.

In some examples, the micro-lens includes a condenser micro-lens.

In some examples, the condenser micro-lens includes convex lenses, and the convex lenses are arranged in one-to-one correspondence with the plurality of light sources, in a light-emitting direction of the plurality of light sources.

In some examples, a main axis of the convex lens does not coincide with the chief light of the light emitted by the light source corresponding to the convex lens.

In some examples, the condenser micro-lens includes a first cylindrical lens, and the first cylindrical lens is correspondingly arranged in a light-emitting direction of the plurality of light sources arranged along the first direction.

In some examples, a plane where the chief light of the plurality of light sources arranged along the first direction is located is a first plane; and a main axis of the first cylindrical lens does not completely coincide with the first plane.

In some examples, the condenser micro-lens further includes a second cylindrical lens, the second cylindrical lens is between the first cylindrical lens and the reflector device for displaying, and a main axis of the second cylindrical lens is perpendicular to a main axis of the first cylindrical lens.

In some examples, the plurality of light sources include at least one selected from the group consisting of a red light-emitting diode, a green light-emitting diode and a blue light-emitting diode.

In some examples, an appearance of the light-emitting diode and an arrangement of a plurality of light-emitting diodes adopt at least one selected from the group consisting of the following: the appearance of the light-emitting diode is in a round shape, and the plurality of light-emitting diodes are closely arranged; the appearance of the light-emitting diode is in a triangular shape, and the plurality of light-emitting diodes are closely arranged; the appearance of the light-emitting diode is in a rectangular shape, and the plurality of light-emitting diodes are closely arranged; the appearance of the light-emitting diode is in a hexagonal shape, and the plurality of light-emitting diodes are closely arranged; the appearance of the light-emitting diode is in an octagonal shape, and the plurality of light-emitting diodes are closely arranged; the appearance of the light-emitting diode is in a round shape or an octagonal shape, the plurality of light-emitting diodes are closely arranged, and a light-emitting diode having a size matched with a size of a gap between every four light-emitting diodes is additionally arranged in the gap; and the plurality of light-emitting diodes are arranged according to a first distortion state, and the first distortion state is opposite and corresponding to a second distortion state of the reflector device for displaying.

In some examples, the head-up display system further includes a diffuser element; the diffuser element is at a side, away from the plurality of light sources, of the micro-lens array, the light exited from the micro-lens array is diffused after passing through the diffuser element, and diffused light is incident on the reflector device for displaying.

In some examples, the diffuser element includes at least one selected from the group consisting of a diffractive optical element and a scattering optical element.

In some examples, the diffuser element is configured to convert the light exited from the micro-lens array into a light beam with a predetermined cross-sectional shape.

In some examples, the head-up display system further includes a light-emitting control unit; the light-emitting control unit is electrically connected with the plurality of light sources, respectively, and is configured to control a light-emitting state of the plurality of light sources to form image light.

In some examples, the head-up display system further includes a light blocking member; the light blocking member is at a side, away from the plurality of light sources, of the micro-lens array, and is configured to limit an exit angle of the light exited from the micro-lens array.

In some examples, the head-up display system includes a plurality of micro-lens arrays; each micro-lens array of the plurality of micro-lens arrays is configured to concentrate chief light of light emitted by the plurality of light sources corresponding to the each micro-lens array, so that chief light of light exited from the plurality of micro-lens arrays is directed to different predetermined ranges; the light exited from the plurality of micro-lens arrays is incident on the reflector device for displaying and is reflected on the surface of the reflector device for displaying, and the reflected light is incident into different observation regions.

In some examples, the head-up display system further includes a stereoscopic vision forming layer at a side, away from the plurality of light sources, of the micro-lens array, and the stereoscopic vision forming layer is configured to allow light passing through the stereoscopic vision forming layer to be incident to a first position and a second position, respectively.

In some examples, the stereoscopic vision forming layer includes: a plurality of barrier units arranged at intervals; a predetermined distance is between the barrier unit and the micro-lens array.

In some examples, the stereoscopic vision forming layer includes a light splitting lens layer; the light splitting lens layer includes a plurality of light splitting lenses.

In some examples, the head-up display system further includes at least one reflector element; the at least one reflector element is between the micro-lens array and the reflector device for displaying; the at least one reflector element includes at least one selected from the group consisting of a curved reflector element and a planar reflector element.

In some examples, main axes of at least two micro-lenses of the plurality of micro-lenses are different from each other, so that the chief light of light exited from the micro-lens array is directed to the predetermined range.

In some examples, the plurality of light sources are excited by an electric field to generate light.

According to at least one embodiment of the present disclosure, an active light-emitting image source is provided. The active light-emitting image source includes: a light source array including a plurality of light sources arranged in an array; a light controller device configured to concentrate chief light of light emitted by the plurality of light sources, so that chief light of light after being exited from the micro-lens array is directed to a predetermined range; and a diffuser element at a light exit side of the light controller device, and the light exited from the light controller device is diffused after passing through the diffuser element, so as to convert the light exited from the light controller device into a light beam with a predetermined cross-sectional shape.

According to at least one embodiment of the present disclosure, a head-up display is provided. The head-up display includes the active light-emitting image source described above and a reflector device for displaying, wherein the reflector device for displaying is at a light exit side of the diffuser element to allow light exited from the diffuser element to be incident into an observation region.

According to at least one embodiment of the present disclosure, a motor vehicle is provided. The motor vehicle includes any head-up display system described above or the head-up display described above.

BRIEF DESCRIPTION OF THE DRAWINGS

In order to more clearly illustrate the technical solutions of the embodiments of the present disclosure, the drawings of the embodiments will be briefly described in the following; it is obvious that the described drawings are only related to some embodiments of the present disclosure and thus are not limitative to the present disclosure.

FIG. 12a is a schematic diagram illustrating an arrangement of light-emitting diodes of a head-up display system provided by an embodiment of the present disclosure;

FIG. 12b is a schematic diagram illustrating an arrangement of light-emitting diodes of a head-up display system provided by the embodiment of the present disclosure;

FIG. 13a is a schematic diagram illustrating an arrangement of light-emitting diodes of a head-up display system provided by an embodiment of the present disclosure;

DETAILED DESCRIPTION

Figure 1:
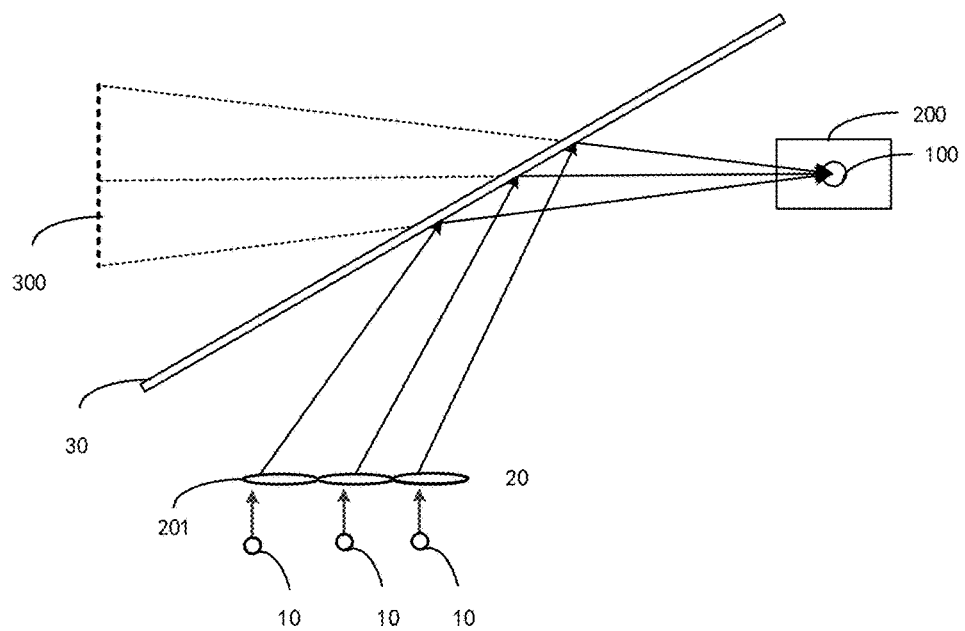
FIG. 1 illustrates a schematic structural diagram of a head-up display system provided by an embodiment of the present disclosure.

In order to make objects, technical solutions and advantages of the embodiments of the present disclosure more apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

It should be noted that the illustrations provided in the following embodiments only illustrate the basic idea of the present disclosure in a schematic way, and only the components related to the present disclosure are shown in the drawings instead of drawing according to the number, shape and size of the components in actual implementation. The type, number and proportion of various components in actual implementation can be arbitrarily changed, and the layout of the components may be more complicated.

It should be noted that, in order to be concise and intuitive in description, several representative embodiments are described below to illustrate the technical solution(s) of the present disclosure. Many details in the embodiments are only used to assist in understanding the technical solution(s) of the present disclosure. However, it is obvious that the implementation of the technical solution(s) of the present disclosure may not be limited to these details. In order to avoid unnecessarily obscuring the technical solution(s) of the present disclosure, some embodiments are not described in details, but only a framework is given. Hereinafter, "comprising/including" means "comprising/including but not limited to", and "according to . . . " means "at least according to . . . , but not limited to only according to . . . ". "First", "second", etc. are only used to refer to features, and are not intended to impose any restrictions on the features, such as restrictions in sequence. Due to the language habit of Chinese, when the number of a component is not specified in the following, it means that the component can be one or more, or can be understood as at least one.

The embodiment provides a head-up display system, as shown in FIG. 1, the head-up display system includes: a plurality of light sources 10 excited by an electric field to generate light, and the plurality of light sources 10 are arranged according to a predetermined rule; a micro-lens array 20 including a plurality of micro-lenses 201, each micro-lens 201 corresponds to one or more light sources 10 and adjusts a direction of chief light of light emitted by the corresponding one or more light sources 10; the micro-lens array 20 converges the chief light of light emitted by the plurality of light sources 10 to a predetermined range 100; and a reflector device for displaying 30 disposed at a side, away from the light sources 10, of the micro-lens array 20. After passing through the micro-lens array 20, the light emitted by the plurality of light sources 10 is emitted to the reflector device for displaying 30 and reflected on a surface of the reflector device for displaying 30, and then the reflected light is incident into an observation region 200. For example, the above-mentioned "chief light" refers to a center line of a light beam. In addition, the above embodiments have been described with reference to the case where a plurality of light sources 10 generates light through an excitation by an electric field, but the embodiments according to the present disclosure are not limited to this, and the plurality of light sources may also adopt other types of light sources.

In some examples, all or part of the plurality of light sources may be independently controlled to emit light, so as to form image light. For example, the plurality of light sources can be white light sources, so that gray-scale images can be formed; alternatively, the plurality of light sources may also include light sources of different colors such as red, green and blue, and colored images may be formed by controlling the brightness of the light sources of different colors.

In this embodiment, for example, the light source 10 is excited by an electric field to generate light, and the light source 10 is a point light source, that is, the light emitted by the light source 10 has a certain divergence angle and is emitted towards different directions. In this embodiment, by arranging the micro-lens array 20, the directions of chief light of the light emitted by a plurality of light sources 10 can be adjusted, and the chief light is converged in a predetermined range, thereby changing the propagation direction of the light. Then the converged light is reflected by the reflector device for displaying 30, and the reflected light reaches the observation region 200, so that the observer with eyes located in the observation region 200 can see a virtual image 300, the virtual image 300 is a virtual image of the image formed by the plurality of light sources 10 arranged according to a predetermined rule, and is formed by the reflector device for displaying 30. For example, the observer can be a driver or a passenger. In such case, in this case, a region where the observer needs to watch the imaging can be predetermined according to actual demands, that is, an eyebox, which refers to a region where the observer's eyes are located and the HUD image can be seen. In such case, it only requires the observation region 200 to cover the eyebox. In some examples, the size of the observation region 200 is close to the range of the eyebox and just covers the range of the eyebox. In this embodiment, both the eyebox and the observation region 200 have certain sizes. Even if the eyes of the observer deviate from the center of the eyebox by a certain distance, such as by moving upwards, downwards, leftwards and rightwards for a certain distance, the observer will still see the HUD image as long as the eyes of the observer are still located in the eyebox.

Figure 2:
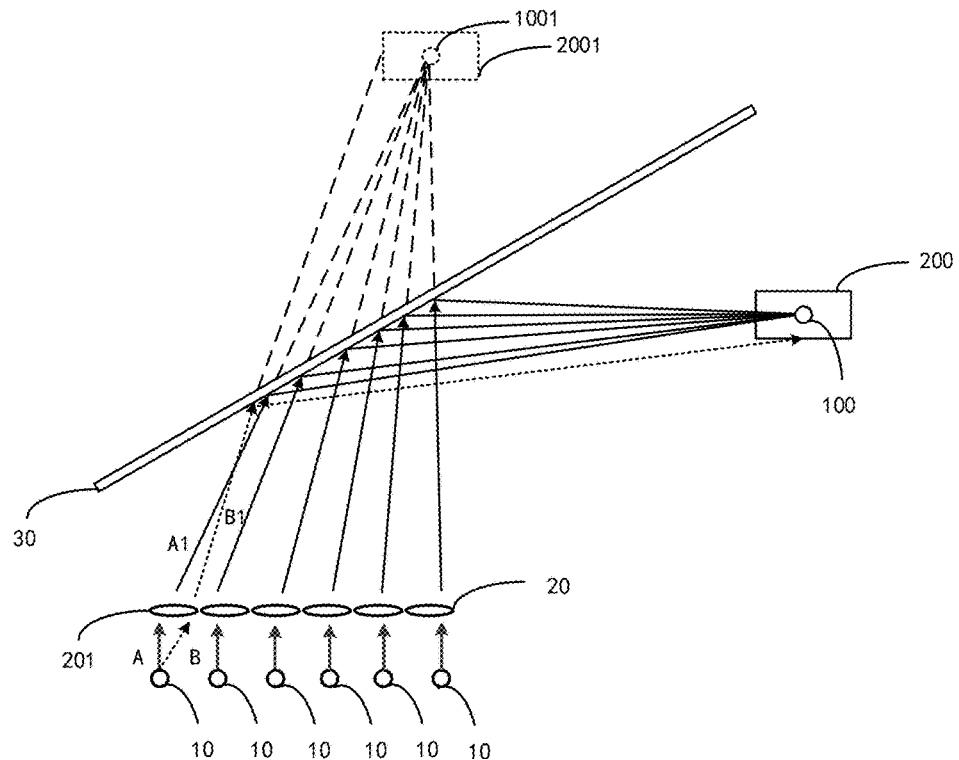
FIG. 2 illustrates a schematic structural diagram of a head-up display system provided by an embodiment of the present disclosure.

FIG. 2 illustrates the specific working principle of the head-up display system according to this embodiment. For convenience of explanation, both FIGS. 1 and 2 illustrate the case where the reflector device for displaying 30 is in a planar form, by way of example. The head-up display system includes a plurality of light sources 10, which can be, for example, electroluminescent devices such as light-emitting diode (LED), organic light-emitting diode (OLED), Mini LED, Micro LED, cold cathode fluorescent lamp (CCFL), cold LED light (CLL), electro luminescent (EL) device, field emission display (FED) or quantum dot (QD) light-emitting device, etc. When the plurality of light sources 10 are arranged according to a predetermined rule, image light can be formed; for example, when LEDs are arranged in sequence in arrays, gray-scale images can be formed by utilizing the LED arrays which can emit light with different brightness; if the LED is a colored LED which can emit red light, green light or blue light, a colored image can be formed by controlling the on-off and brightness of the LED. In some examples, the light source 10 can be Mini LED or Micro LED, and the image formed by a plurality of light sources 10 arranged according to a predetermined rule are clearer and finer, with higher resolution and lower energy consumption.

In FIG. 2, the solid arrow represents the direction of chief light of the light emitted by the light source 10, the direction of chief light passes through the center of the energy distribution of the light source 10 and is directed to the direction of the maximum light intensity of the light source 10. For example, the direction of chief light can also be the direction of the symmetry axis of light intensity distribution of the light source 10, which is generally the direction of central axis of the light emitted by the light source 10. The direction of chief light represents the main propagation direction of the light, and the light intensity of light in the direction of chief light and close to the direction of chief light is larger than the light intensity of light in other directions. In FIG. 2, each micro-lens 201 corresponds to one light source 10, the direction of chief light of light emitted by the light source 10 is the central axis direction of the light source 10 and is changed after the light passing through the micro-lens 201. Taking the direction A of chief light of the light emitted by the leftmost light source 10 in FIG. 2 as an example, the direction of chief light is changed from A to A1 after the light passes through the micro-lens, and a plurality of micro-lenses 201 changes the directions of chief light of the light emitted by the corresponding light sources respectively, so that after the light emitted by a plurality of light sources 10 passes through the micro-lens array 20, a plurality of directions of chief light is changed and the chief light is converged in a predetermined range 100. It can be understood that the predetermined range can be a point or a smaller region, which is not limited in this embodiment. In FIG. 2, the case where the chief light of a plurality of light sources 10 is converged in a small region is described by way of example; when a reflector device for displaying 30 is provided, the chief light of the plurality of light sources is converged in a predetermined range 100; when the reflector device for displaying 30 is not provided, the chief light A1 extends along the dashed line as shown in the figure, and the chief light of the plurality of light sources is still converged in a certain range. It can be understood that, this range is a mirrored position 1001 of the predetermined range 100 relative to the reflector device for displaying 30, and for example, the mirrored position 1001 is regarded as a position of a virtual image of the predetermined range 100 relative to the reflector device for displaying 30. That is, in this embodiment, the micro-lens array 20 converges the chief light of the light emitted by a plurality of light sources 10 to a predetermined range 100, which means that the micro-lens array 20 converges the chief light of the light emitted by the light sources 10 to a predetermined range 100 after being reflected by the reflector device for displaying 30.

Based on the above description, it can be seen that the micro-lens array converges the chief light of the light emitted by a plurality of light sources, so that the chief light of the light exited from the micro-lens array can be directed to a predetermined range, for example, the predetermined range may refer to the predetermined range 1001 in FIG. 2. Here, "be directed to a predetermined range" may refer to that the chief light of the light exited from the micro-lens array or extension lines of the chief light reach the predetermined range 1001. For example, as shown in FIG. 2, if the directions of chief light of the light exited from the micro-lens are not changed by other optical elements after the light exiting the micro-lens, the chief light of the light exited from the micro-lens array will be converged in a predetermined range 1001; on the other hand, if the directions of chief light of the light exited from the micro-lens are changed by other optical elements after the light exiting the micro-lens, the extension lines of the chief light of the light exited from the micro-lens array will be converged in a predetermined range 1001.

Other light emitted by the light source 10 that has a certain angle with respect to the direction of chief light also changes its direction after passing through the micro-lens 201. The micro-lens array 20 concentrates light emitted by a plurality of light sources 10. In FIG. 2, light B (dashed arrows in the figure) emitted by the light source 10 that has a certain angle with respect to the direction of chief light is taken as an example for illustration. After passing through the micro-lens array 20, the light B changes its propagation direction and is concentrated to an observation region 200. It can be understood that, the light emitted by the light source 10 that is as same as or close to the direction of chief light changes its direction of chief light after passing through the micro-lens array, and this part of light will be converged in the predetermined range 100; while the light having a certain angle with respect to the direction of chief light will be concentrated to the observation region 200 after passing through the micro-lens array 20; the observation region 200 is illustrated as a rectangular region in FIG. 2, but it does not mean that the shape of the observation region 200 is rectangle. It should be understood that the observation region 200 includes the predetermined range 100 and is larger than the predetermined range 100, and the light emitted by a plurality of light sources 10 all will be concentrated in the range of the observation region 200, and the chief light is all concentrated in the predetermined range 100 within the observation region, so the light intensity in other region(s) outside the predetermined range 100 within the observation region 200 will be smaller than that in the predetermined range 100. When the reflector device for displaying 30 is provided, the light emitted from the light sources 10 are converged in the observation region 200; when the reflector device for displaying 30 is not provided, the light emitted from the light sources 10 still will be converged in a certain range. It can be understood that this certain range is a mirrored position 2001 of the observation region 200 relative to the reflector device for displaying 30, and for example, the mirrored position 2001 is regarded as a position of a virtual image of the observation region 200 formed by the reflector device for displaying 30.

For example, the areas of the predetermined ranges 100 and 1001 are both smaller than the area of the observation region 200.

For example, the micro-lens 201 includes a condenser micro-lens, which can concentrate the light. The condenser micro-lens includes but is not limited to a convex lens, a Fresnel lens or a cylindrical lens, and also includes a combination of lenses with light concentrating effect, such as a combination of the above lenses or a combination of the above lenses and concave lenses; the diameter of the micro-lens includes millimeter level, micrometer level or nanometer level, for example, the diameter of the micro-lens is 10 nm-1000 nm or 1 μm-1000 μm or 1 mm-100 mm.

The reflector device for displaying 30 is at a side, away from the light sources 10, of the micro-lens array 20. After passing through the micro-lens array 20, the light emitted by a plurality of light sources 10 is emitted to the reflector device for displaying 30 and reflected on a surface of the reflector device for displaying 30, and the reflected light is incident into the observation region 200, so that an observer (for example, a driver or a passenger) can watch an HUD image when his/her eyes are located in the observation region 200. For the convenience of explanation, the embodiments of the present disclosure and the drawings accompanying the specification are schematically explained by illustrating the reflector device for displaying as a plane. The light exited from the micro-lens array 20 reach the observation region 200 after being reflected by the reflector device for displaying 30, so that the observer whose eyes are located in the observation region 200 can watch the image. At this time, the image viewed by the observer is a virtual image formed by the reflector device for displaying 30 in a reflective imaging manner. For example, the observer can be a driver or a passenger. In such case, a region where the observer needs to watch the imaging, that is, the eyebox, can be predetermined according to actual demands. The eyebox refers to a region where the observer's eyes are located and the HUD image can be seen. Also, it only requires the observation region 200 mentioned above to cover the eyebox. Further, for example, the predetermined range 100 is configured to coincide with the eyebox, so that the observer with both eyes within the range of the eyebox can see an image with higher brightness. In this embodiment, the eyebox has a certain size, and even if the observer's eyes deviate from the center of the eyebox by a certain distance, such as moving upwards, downwards, leftwards and rightwards for a certain distance, the observer can still see the HUD image as long as the observer's eyes are still in the eyebox. In practical application, for example, the reflector device for displaying 30 has a curved surface with a certain radian, and the imaging principle thereof is similar with that shown in FIG. 2, without repeated here. It should be understood by those skilled in the art that, in the case of a curved reflector device for displaying 30 such as a windshield, the position of the virtual image is not fixed when observed at different positions. Therefore, when the reflector device for displaying 30 is a windshield or a displaying window with a certain radian, the virtual image in this embodiment refers to the virtual image that can be seen from the observation region 200, that is, the position of the virtual image 300 is a position of a virtual image observed by an observer in the observation region 200.

In some examples, the head-up display system described in this embodiment is installed on a transportation such as a vehicle, and for example, the reflector device for displaying 30 in this embodiment is the windshield of a vehicle; or a transflective film attached to the windshield; or a displaying window formed by a transparent material including transparent resin, polymer transparent material or glass, such as a displaying window of a combiner head-up display (C-HUD) system. The reflector device for displaying 30 has transflective characteristics, so that not only the virtual image formed by reflection can be observed, but also the light outside the vehicle can be transmitted through the reflector device for displaying 30 and reach the observation region 200; in this way, an observer with both eyes in the observation region 200 can also normally watch the scene outside the vehicle. In this embodiment, for example, a plurality of light sources 10 and a micro-lens array 20 are arranged under the windshield of the vehicle and on the surface of the console. Further, for example, a plurality of light sources 10 and a micro-lens array 20 are arranged in a large area, and the light exited from the micro-lens array 20 can form a large-sized image after being reflected by the reflector device for displaying 30, thus further improving the use experience of the head-up display system.

In this embodiment, a plurality of light sources 10 is arranged to form an image, and by arranging the micro-lens array 20, the chief light of the light emitted by the light sources 10 can be concentrated to a predetermined range 100, that is, the light emitted by the plurality of light sources 10 is concentrated to an observation region 200, and is reflected on the surface of the reflector device for displaying 30 to form an image, so that an observer with eyes in the observation region 200 where the light is concentrated can observe the image; and because the light is concentrated, the imaging brightness is higher, and the observer can watch an image with higher brightness, which improves the light utilization rate.

Figure 3A:
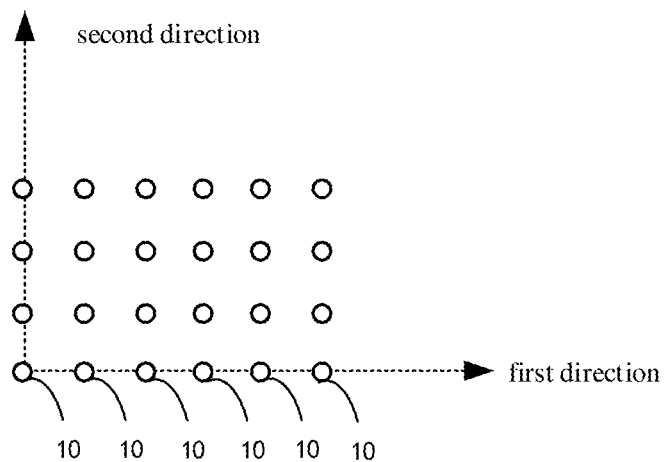
FIG. 3a illustrates a schematic diagram of light sources arranged according to a predetermined rule provided by an embodiment of the present disclosure.
Figure 3B:
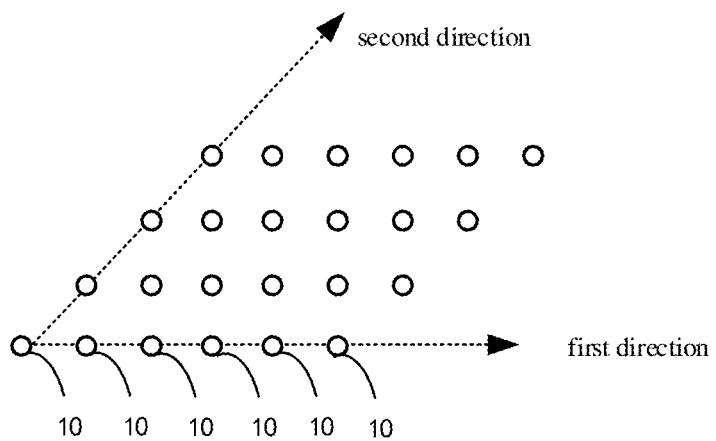
FIG. 3b illustrates a schematic diagram of light sources arranged according to a predetermined rule provided by an embodiment of the present disclosure.

On the basis of the above embodiments of the present disclosure, a plurality of light sources 10 is arranged according to a predetermined rule, which includes the following: the plurality of light sources are arranged along a first direction and a second direction, and the first direction is different from the second direction. For example, as shown in FIG. 3a, the first direction is perpendicular to the second direction. FIG. 3a is a schematic plan view from the light-emitting direction of the light source 10. The first direction includes the horizontal direction, along which the light sources 10 are deployed and arranged. The second direction includes the vertical direction, along which the light sources 10 are deployed and arranged. The light sources 10 are deployed and arranged (array arrangement) along the first direction and the second direction which are perpendicular to each other, so as to form an area light source. The second direction also includes other directions that are not perpendicular to the first direction. As shown in FIG. 3b, the second direction is not perpendicular to the first direction, and there is an included angle θ between the second direction and the first direction, wherein θ∈(0, 90°), and for example, θ is 10°, 20°, 30°, 45° or 80°; in such case, the light sources 10 deployed and arranged along the first direction and the second direction also form an area light source.

Figure 4:
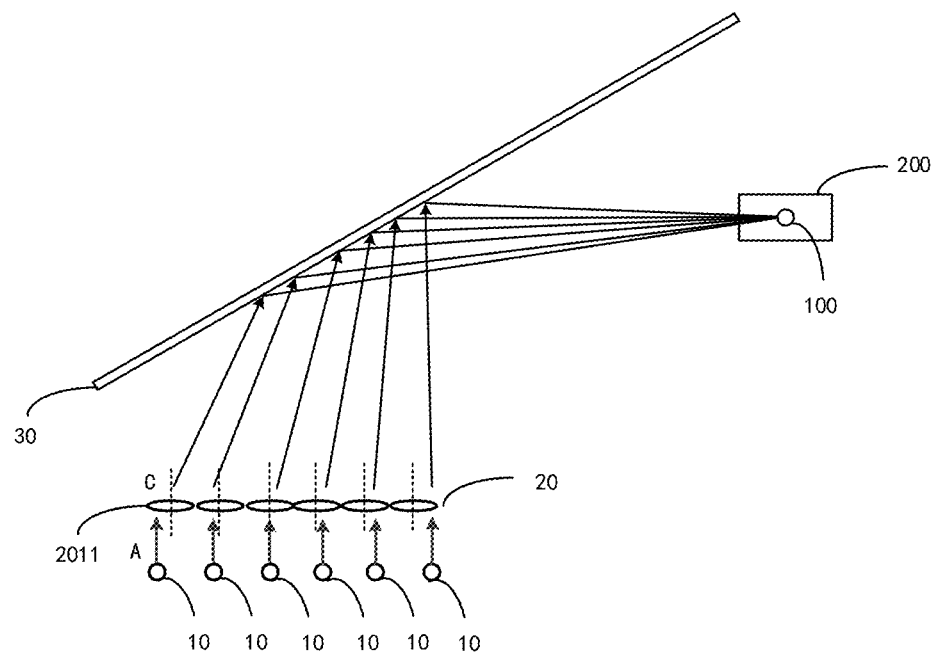
FIG. 4 illustrates a schematic structural diagram of a head-up display system provided by an embodiment of the present disclosure.

On the basis of the above embodiments of the present disclosure, for example, the condenser micro-lens ES is illustratively a convex lens 2011, and convex lenses 2011 are arranged in one-to-one correspondence with the light sources 10. As shown in FIG. 1, FIG. 2 and FIG. 4, each light source 10 is correspondingly provided with one convex lens 2011, which is arranged in the light-emitting direction of the light source 10 and adjusts the direction of chief light of the light emitted by the corresponding light source 10. For example, the convex lens 2011 adjusts the corresponding direction of chief light of the light emitted from the light source 10, including: not changing the direction of chief light of the light emitted from the light source 10, or, changing the direction of chief light of the light emitted from the light source 10.

Further, the main axis C of the convex lens 2011 does not coincide with the chief light A of the light emitted by the light source 10, and the convex lens 2011 changes the direction of chief light of the light emitted by the light source 10 corresponding thereto. For example, the main axis of a convex lens refers to a straight line which passes through the optical center of the convex lens and is perpendicular to the lens. It can be understood by those skilled in the art that the light coincident with the main axis of the convex lens will not change its propagation direction after passing through the convex lens. Thus, if the chief light A of light emitted by the light source 10 coincides with the main axis of the convex lens 2011, its direction will not be changed after the light passing through the convex lens 2011. Therefore, the main axis of the convex lens 2011 is configured to not coincide with the chief light of light emitted by the light source 10, so that the direction of the chief light of the light passing through the convex lens 2011 will be changed. For example, the main axis C is parallel to the chief light A but does not coincide with the chief light A. It can be understood that, after the light emitted by the light source 10 passes through the convex lens 2011, the directions of chief light of the light emitted by all the light sources 10 are changed, and the chief light is concentrated to a predetermined range 100, as shown in FIG. 1. Directions of chief light of light emitted by some light sources 10 are not changed while directions of chief light of light emitted by some other light sources 10 are changed, and the chief light is concentrated to a predetermined range 100, as shown in FIG. 4. Although the chief light of light emitted by some light sources 10 does not change its direction, it will eventually be concentrated to a predetermined range 100. This embodiment does not limit that the chief light of each light source 10 will be changed after passing through the micro-lens array 20, but only requires that the chief light is concentrated to the predetermined range 100. Optionally, the convex lens 2011 includes a plan-convex lens, a lenticular lens or a concave-convex lens, which is not limited in this embodiment.

In this embodiment, convex lenses 2011 are arranged in one-to-one correspondence with the light sources 10, and the direction of chief light of the light emitted by the light source 10 is adjusted by the light concentrating effect of the convex lenses 2011, so that the chief light of the light emitted by a plurality of light sources 10 is converged in a predetermined range 100, the light emitted by the plurality of light sources 10 is reflected by the reflector device for displaying 30 and then concentrated to the observation region 200; in this way, the reflective imaging brightness is higher, and the observer with both eyes in the observation region 200 can watch the imaging with higher brightness, thus improving the light utilization rate.

Figure 5:
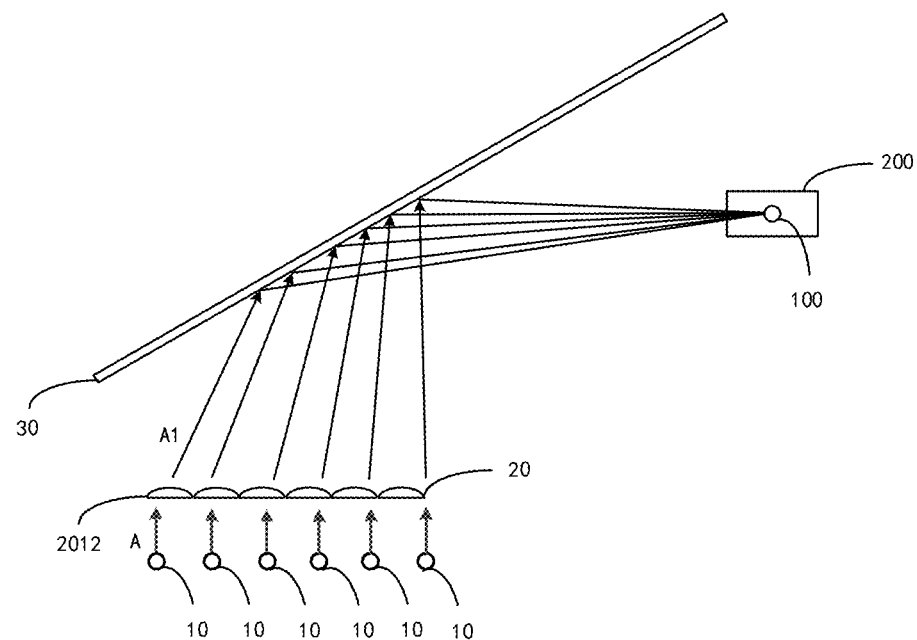
FIG. 5 illustrates a schematic structural diagram of a head-up display system provided by an embodiment of the present disclosure.
Figure 6:
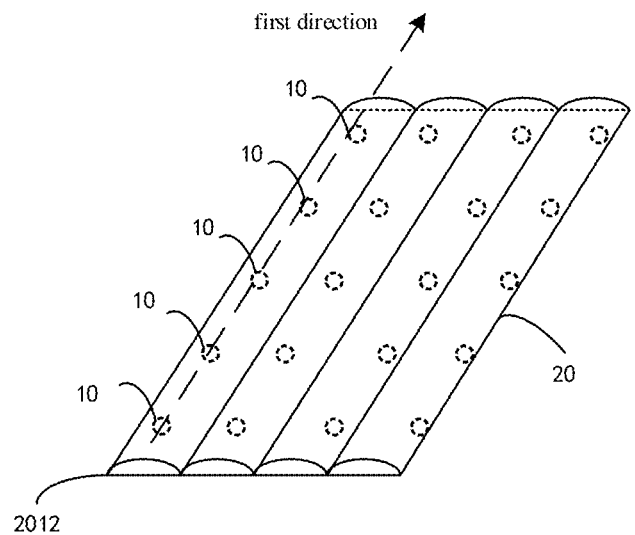
FIG. 6 is a schematic diagram illustrating an arrangement of a plurality of light sources corresponding to cylindrical lenses provided by an embodiment of the present disclosure.
Figure 7:
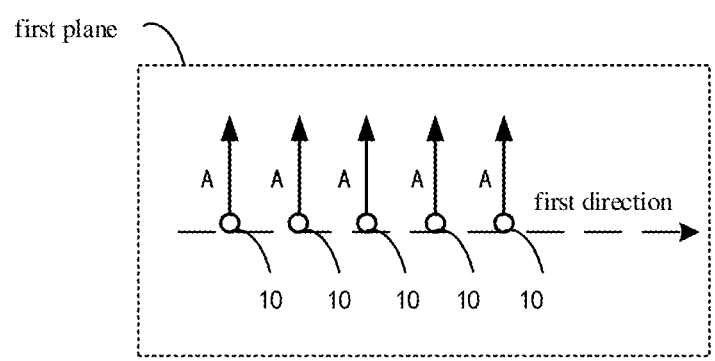
FIG. 7 illustrates a schematic diagram of a first plane where chief light of a plurality of light sources are located provided by an embodiment of the present disclosure are located.

On the basis of the above embodiments of the present disclosure, the condenser micro-lens includes a first cylindrical lens 2012, which is correspondingly arranged in the light-emitting direction of a plurality of light sources 10 deployed and arranged along the first direction, and adjusts the direction of chief light of light emitted by the corresponding light source 10. As shown in FIGS. 5 and 6, the micro-lens array 20 includes a plurality of first cylindrical lenses 2012, the first cylindrical lenses 2012 are correspondingly arranged in the light-emitting direction of the plurality of light sources 10 deployed and arranged along the first direction. As shown in FIG. 7, a plane, where the chief light A of light emitted by the plurality of light sources 10 that are deployed and arranged along the first direction and correspond to each first cylindrical lens 2012 are located, is a first plane, and the chief light of the light emitted by the plurality of light sources 10 is concentrated to a predetermined range 100 after passing through the first cylindrical lens corresponding to the plurality of light sources 10. For example, the cylindrical lens 2012 adjusts the directions of chief light of the light emitted by the plurality of light sources 10 corresponding thereto, including: not changing the directions of chief light of the light emitted by the plurality of light sources 10, or changing the directions of chief light of the light emitted by the plurality of light sources 10.

Figure 8A:
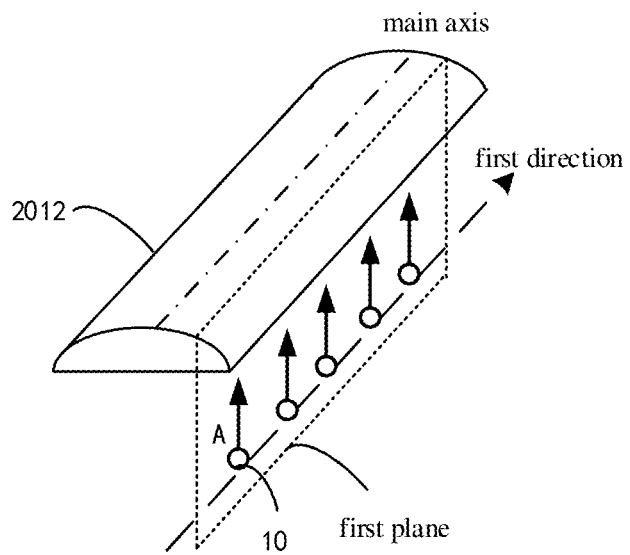
FIG. 8a illustrates a first schematic diagram of a positional relationship between a first plane where the chief light of a plurality of light sources are located and a main axis of a cylindrical lens provided by an embodiment of the present disclosure.
Figure 8B:
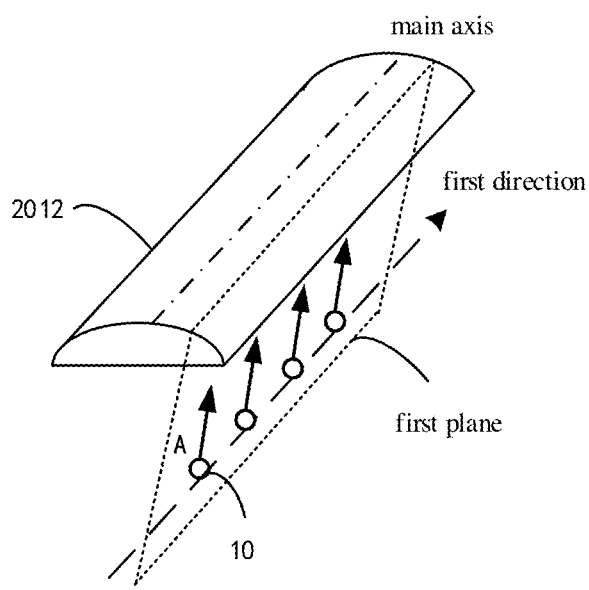
FIG. 8b illustrates a second schematic diagram of a positional relationship between a first plane where chief light of a plurality of light sources are located and a main axis of a cylindrical lens provided by the embodiment of the present disclosure.
Figure 8C:
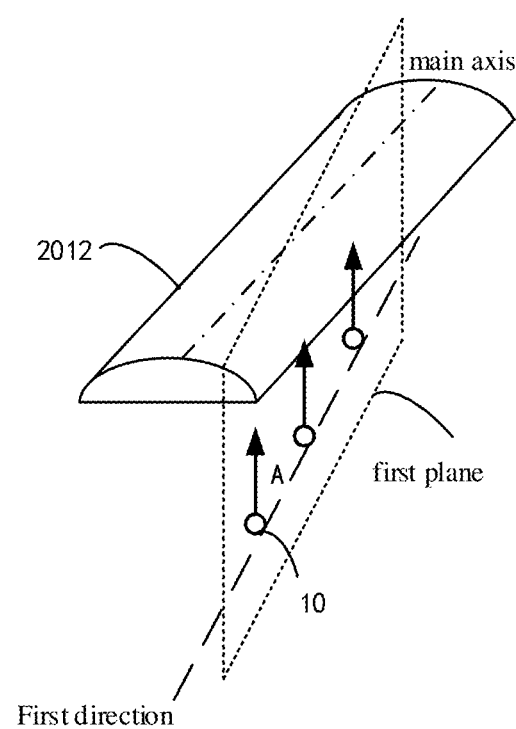
FIG. 8c illustrates a third schematic diagram of a positional relationship between a first plane where chief light of a plurality of light sources are located and a main axis of a cylindrical lens provided by the embodiment of the present disclosure.

Further, the main axis of the first cylindrical lens 2012 does not completely coincide with the first plane, and the first cylindrical lens 2012 changes the directions of chief light of the light emitted by the plurality of light sources 10 corresponding thereto. For example, as shown in FIG. 8a, the main axis of the first cylindrical lens is the axial meridian of the cylinder of the first cylindrical lens, and those skilled in the art can understand that the light passing through the axial meridian will not change its degree of concentrating, that is, its propagation direction will not be changed. Therefore, if the first plane completely coincides with the main axis of the first cylindrical lens 2012, that is, if the main axis is on the first plane, the directions of chief light A of light emitted by a plurality of light sources 10 will not be changed after passing through the first cylindrical lens 2012. Thus the main axis of the first cylindrical lens 2012 is configured to not completely coincide with the first plane. As shown in FIGS. 8a and 8b, the main axis of the first cylindrical lens 2012 is parallel to the first plane but does not coincide with the first plane, and the directions of chief light of light emitted by a plurality of light sources 10 will be changed and the chief light will be concentrated to a predetermined range 100. It can be understood that the first plane may also intersect with the main axis of the first cylindrical lens, as shown in FIG. 8c, the chief light of light emitted by one or more light sources 10 corresponding to the intersection pass through the main axis of the first cylindrical lens 2012, and the directions of the chief light will not be changed, but the chief light will eventually be concentrated to the predetermined range 100. This embodiment does not limit that the chief light of light emitted by each light source 10 will be changed after the light passing through the micro-lens array 20, but only requires that the chief light is concentrated to the predetermined range 100. Optionally, the first cylindrical lens includes planoconvex cylindrical lens, biconvex cylindrical lens, meniscus cylindrical lens, orthogonally cylindrical lens, special-shaped cylindrical lens and one or more of the above lens combinations, that is, for example, the first cylindrical lens is planoconvex cylindrical lens, biconvex cylindrical lens, meniscus cylindrical lens, orthogonally cylindrical lens, special-shaped cylindrical lens and lens combinations (such as the combination of planoconvex cylindrical lens and meniscus cylindrical lens), which is not limited in this embodiment.

In this embodiment, the first cylindrical lens 2012 corresponding to a plurality of light sources 10 deployed and arranged along the first direction is arranged, and the directions of chief light of the light emitted by the light sources 10 are adjusted by the light concentrating action of the cylindrical lens, so that the chief light of the light emitted by a plurality of light sources 10 is converged in a predetermined range 100 and the light emitted by the plurality of light sources 10 is concentrated to an observation region 200; in this way, the reflective imaging brightness is higher, and an observer with both eyes in the observation region 200 can watch the imaging with higher brightness, thus improving the light utilization rate. In addition, the implementation of one cylindrical lens 2012 corresponding to a plurality of light sources 10 is adopted, which is simpler and easier in practical application, and is easy to install and disassemble.

Figure 9:
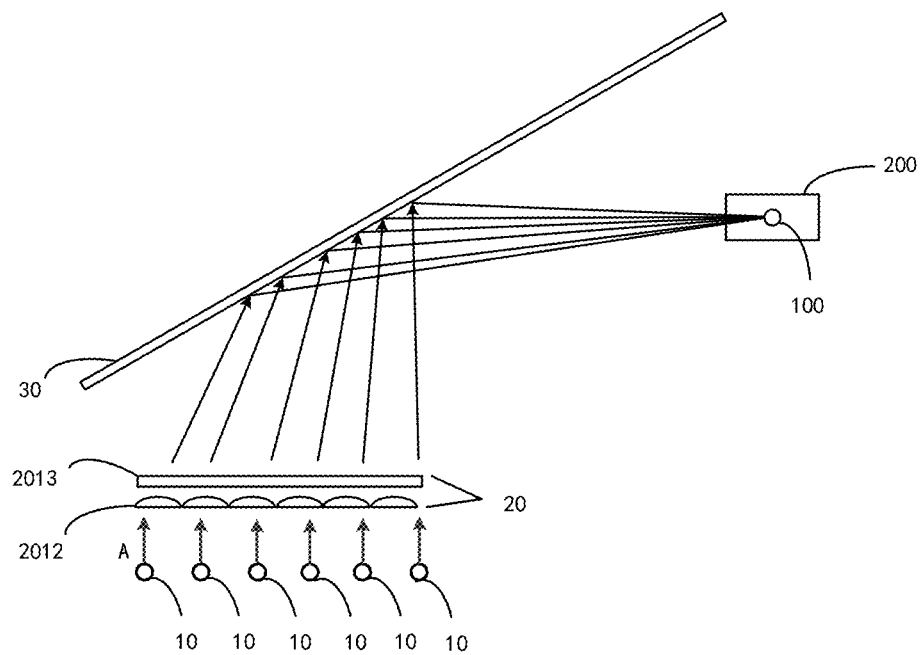
FIG. 9 illustrates a schematic structural diagram of a head-up display system provided by an embodiment of the present disclosure.
Figure 10:
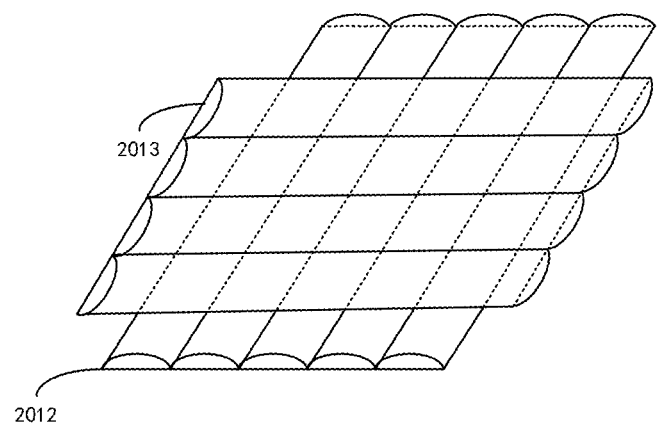
FIG. 10 illustrates a schematic diagram of a first cylindrical lens and a second cylindrical lens provided by an embodiment of the present disclosure.

On the basis of the above embodiments of the present disclosure, the condenser micro-lens further includes a second cylindrical lens 2013, the second cylindrical lens 2013 is arranged between the first cylindrical lens 2012 and the reflector device for displaying 30, and the main axis of the second cylindrical lens 2013 is perpendicular to the main axis of the first cylindrical lens 2012. For example, as shown in FIG. 9, the second cylindrical lens 2013 is arranged between the first cylindrical lens 2012 and the reflector device for displaying 30; the light exited from the first cylindrical lens 2012 passes through the second cylindrical lens 2013 and is incident to the reflector device for displaying 30, and then is concentrated to the observation region 200. The main axis of the second cylindrical lens 2013 is the axial meridian of the cylinder of the second cylindrical lens. A cylindrical lens will not change the direction and the degree of concentrating of the light passing through the main axis thereof. Thus, as shown in FIG. 5, after the light emitted by the light sources 10 pass through the first cylindrical lens 2012, it will change its direction and its degree of concentrating in the direction perpendicular to the main axis of the first cylindrical lens 2012 (that is, the meridian direction of refractive power of the cylindrical lens). Therefore, the light will not be concentrated in the direction parallel to the main axis of the first cylindrical lens 2012, and the predetermined range 100 where the chief light of a plurality of light sources 10 is concentrated is a strip-shaped region, and the observation region 200 where the light is finally concentrated is also a strip-shaped region. In order to increase the degree of light concentrating and further improve the light utilization rate, a second cylindrical lens 2013 is arranged between the first cylindrical lens 2012 and the reflector device for displaying 30. As shown in FIG. 10, the micro-lens array 20 includes a plurality of first cylindrical lenses 2012 and a plurality of second cylindrical lenses 2013 stacked with the first cylindrical lenses 2012, and the main axes of the second cylindrical lenses 2013 are perpendicular to the main axes of the first cylindrical lenses 2012, so that part of the light unable to be changed in its direction and degree of concentrating by the first cylindrical lenses 2012 will be concentrated by the second cylindrical lenses 2013, again, and the light concentrated twice will be converged in the observation region 200, thereby improving the degree of light concentrating and further increasing the light utilization rate.

In this embodiment, the micro-lens array 20 includes a plurality of first cylindrical lenses 2012 and second cylindrical lenses 2013 whose main axes are perpendicular to each other, and adjusts the directions of chief light of the light emitted by the light sources 10 by means of the light concentrating actions of the first cylindrical lenses and the second cylindrical lenses in different directions, so that the chief light of the light emitted by a plurality of light sources 10 is converged in a predetermined range 100, and the light emitted by a plurality of light sources 10 is concentrated to an observation region 200; in this way, the reflective imaging brightness is higher, and an observer with both eyes in the observation region 200 can watch the imaging with higher brightness, thus improving the light utilization rate.

In addition, the implementation of one cylindrical lens corresponding to a plurality of light sources 10 is adopted, which is simpler and easier in practical application, and is easy to install and disassemble.

On the basis of the above embodiments of the present disclosure, the light source 10 includes at least one of a red light-emitting diode, a green light-emitting diode and a blue light-emitting diode, for example, a gallium arsenide diode emitting red light spectrum, a gallium phosphide diode emitting green light spectrum, a silicon carbide diode emitting yellow light spectrum, and a gallium nitride diode emitting blue light spectrum. In an exemplary embodiment, the light source 10 is composed of red light-emitting diodes, green light-emitting diodes and blue light-emitting diodes, and for example, colored images are formed by controlling the on-off and luminous brightness of the LEDs.

In some examples, the light emitted by the light source 10 in this embodiment is narrowband light, which means that the full width at half maximum (FWHM) of the wavelength band of the light is less than or equal to 60 nm, preferably, the FWHM of the wavelength band is less than or equal to 30 nm, and more preferably, the FWHM of the wavelength band is less than or equal to 10 nm. If the light source 10 is a red light-emitting diode, the peak value of the narrowband light emitted by the light source 10 is within the interval range of 590 nm-690 nm; if the light source 10 is a green light-emitting diode, the peak value of the narrowband light emitted by the light source 10 is within the interval range of 500 nm-580 nm; if the light source 10 is a blue light-emitting diode, the peak value of the narrowband light emitted by the light source 10 is within the interval range of 400 nm-470 nm. It can be understood that, in order for the HUD to display colored images, the plurality of light sources 10 include red light-emitting diodes, green light-emitting diodes and blue light-emitting diodes. In a preferred embodiment, the light sources 10 emit red narrowband light with a waveband of 630 nm±10 nm, green narrowband light with a waveband of 540 nm±10 nm and blue narrowband light with a waveband of 450 nm±10 nm (blue), that is, there are three wavebands. It can be understood that the plurality of light sources 10 emitting narrowband light are arranged to form an image, which can generate a wider spectral color gamut and allows for more vivid and colorful image.

Further, the light source 10 is a light-emitting diode 101, and a plurality of light-emitting diodes is closely arranged. It can be understood that light-emitting diodes are generally point light sources. If the light-emitting diodes are arranged in a scattered manner, there will be gaps between the plurality of light-emitting diodes 101, and the finally observed image will present strong graininess sensation. Therefore, the plurality of light-emitting diodes 101 closely arranged can improve the space utilization rate and provide a good viewing experience. In this embodiment, "be closely arranged" means that, with such arrangement, there may be no gap or very small gap between the LEDs 101.

Figure 11A:
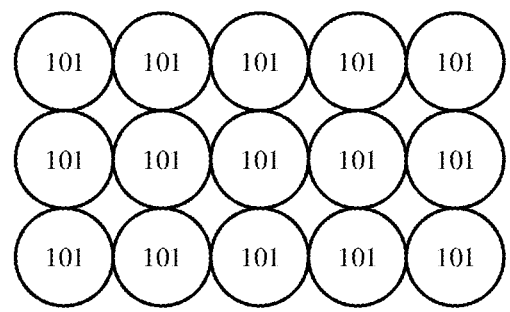
FIG. 11a is a schematic diagram illustrating an arrangement of light-emitting diodes of a head-up display system provided by an embodiment of the present disclosure.
Figure 11B:
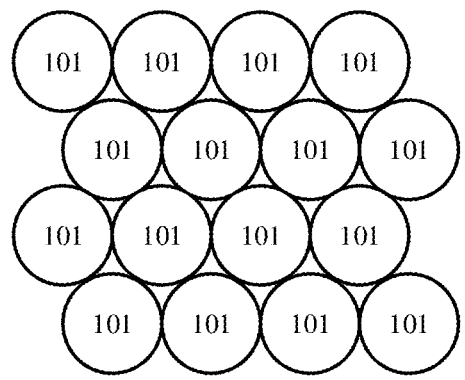
FIG. 11b is a schematic diagram illustrating an arrangement of light-emitting diodes of a head-up display system provided by an embodiment of the present disclosure.
Figure 13B:
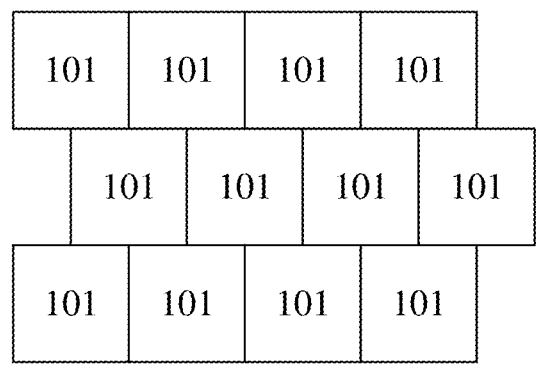
FIG. 13b is a schematic diagram illustrating an arrangement of light-emitting diodes of a head-up display system provided by an embodiment of the present disclosure.
Figure 14:
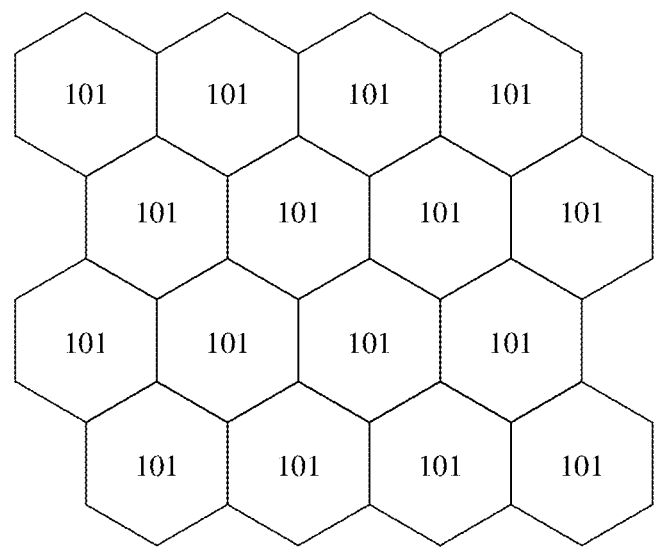
FIG. 14 is a schematic diagram illustrating an arrangement of light-emitting diodes of a head-up display system provided by an embodiment of the present disclosure.

For example, by designing the appearance of the light-emitting diode, the compact arrangement of light-emitting diodes can be realized. The "appearance of the light-emitting diode" in this embodiment specifically refers to the shape characteristics of the light-emitting surface of the light-emitting diode. For example, when the appearance of the LED 101 is in a triangular shape (e.g., regular triangle), a quadrilateral shape (e.g., diamond, rectangle, etc.) or a hexagonal shape (e.g., regular hexagon), a plurality of LEDs 101 are completely closely stacked and arranged. Optionally, as shown in FIG. 11*a* and FIG. 11*b*, the appearance of the light-emitting diode 101 is in a round shape, and the plurality of light-emitting diodes 101 are closely arranged, so that there is a large gap between the light-emitting diodes. FIG. 12*a* and FIG. 12*b* respectively illustrate light-emitting diodes 101 with triangular appearance are completely closely arranged in two forms, in which the appearance of the light-emitting diode 101 is in a triangular shape, and the plurality of light-emitting diodes 101 are completely closely arranged without gaps therebetween. FIG. 13*a* and FIG. 13*b* respectively illustrate light-emitting diodes 101 with rectangular appearance are completely closely arranged in two forms, in which the appearance of the light-emitting diode 101 is in a rectangular shape, and the plurality of light-emitting diodes 101 are completely closely arranged. Referring to FIG. 14, the appearance of the light-emitting diode 101 is in a regular hexagon shape, and the plurality of light-emitting diodes 101 are completely closely arranged.

Figure 15A:
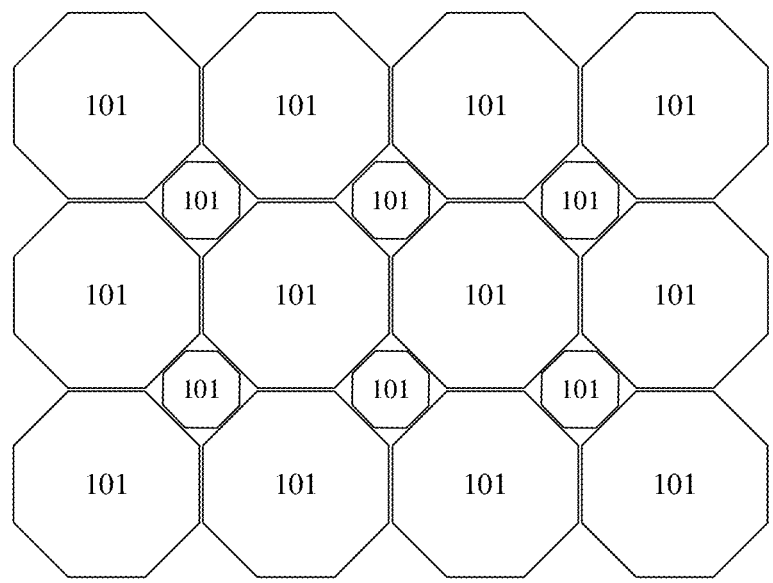
FIG. 15a is a schematic diagram illustrating an arrangement of light-emitting diodes of a head-up display system provided by an embodiment of the present disclosure.
Figure 15B:
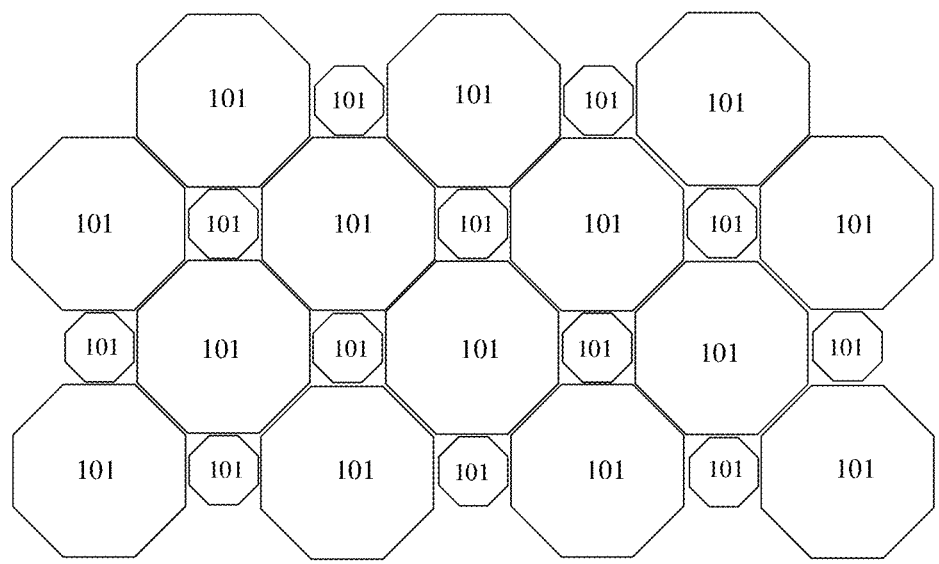
FIG. 15b is a schematic diagram illustrating an arrangement of light-emitting diodes of a head-up display system provided by an embodiment of the present disclosure.

Optionally, the appearance of the light-emitting diode 101 can also be in an octagonal shape (for example, regular octagon), and the plurality of light-emitting diodes 101 are closely arranged; further, since the shape of octagon cannot allow for completely close arrangement, the gaps among the plurality of light-emitting diodes 101 can be filled with smaller light-emitting diodes. For example, as shown in FIG. 15*a* and FIG. 15*b*, a light-emitting diodes 101 with a size matched with the gap between the plurality of light-emitting diodes 101 is additionally arranged in the gap. The light-emitting diode 101 filled in the gap can be of any shape, which is also illustrated as an octagonal shape in the figure by way of example. For example, as used herein, the size of the LED being matched with the gap means that the gap can just be filled with an LED with a certain size.

Optionally, when the reflector device for displaying 30 is a windshield or a transparent displaying window of a C-HUD on a transportation, the windshield and the displaying window usually are not planar but have a certain radian, and the problem of distortion may exist when the reflector device for displaying 30 performs reflective imaging by directly relying on the windshield or the displaying window. In this embodiment, the plurality of light-emitting diodes 101 are arranged according to a first distortion state, which is opposite to and corresponding to a second distortion state of the reflector device for displaying 30. For example, the second distortion state of the reflector device for displaying 30 refers to a distortion state of the virtual image when the image source 1 of the head-up display system is reflected and imaged by the reflector device for displaying 30. The image source 1 includes a plurality of light sources 10, a micro-lens array 20 and the like. The image source 1 emits image light.

Figure 16A:
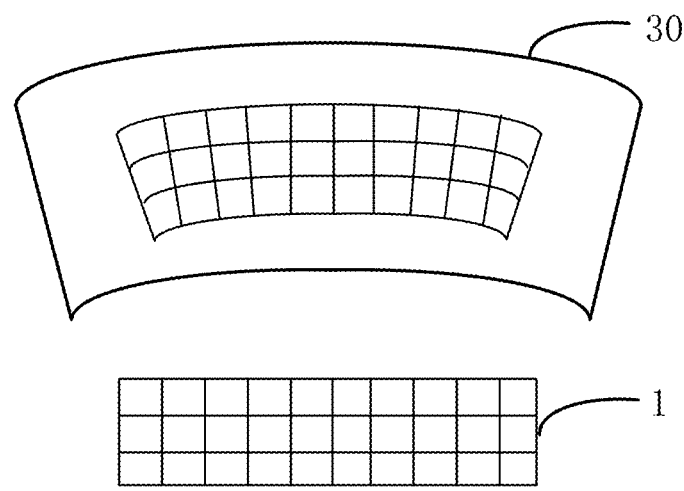
FIG. 16a illustrates a schematic imaging diagram of a distorted virtual image formed by reflecting an image source provided by an embodiment of the present disclosure.
Figure 16B:
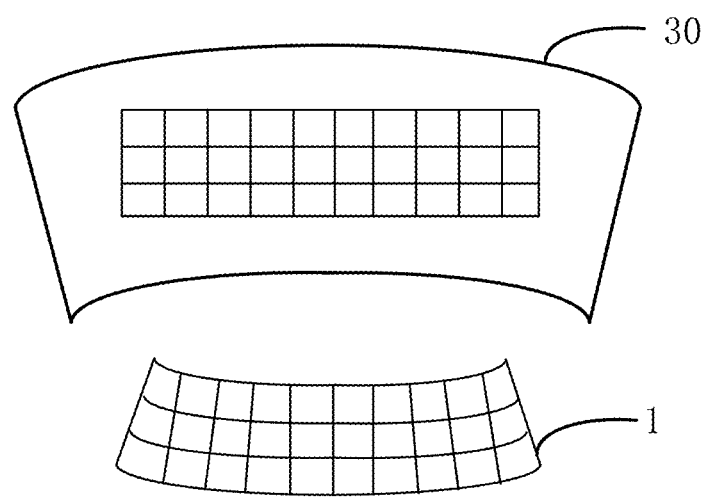
FIG. 16b is a first imaging diagram illustrating a reflective imaging of an image source with distortion elimination provided by an embodiment of the present disclosure.

For example, as shown in FIG. 16*a* and FIG. 16*b*, for convenience of description, an image source 1 is used and explained instead of a plurality of light sources 10 and a micro-lens array 20. The image source 1 is reflected and imaged by the reflector device for displaying 30. However, because a reflector device for displaying 30 with a certain radian has a second distortion state, the virtual image is a distorted virtual image. The grid pattern on the reflector device for displaying 30 in FIG. 16*a* represents the distorted virtual image. In this embodiment, according to the second distortion state of the reflector device for displaying 30, the first distortion state that corresponds and opposite thereto is determined, and the plurality of light-emitting diodes 101 in the image source 1 are arranged according to the first distortion state, for example, the position of each light-emitting diode 101 is configured, so as to eliminate the distortion caused by the reflector device for displaying 30. For example, as shown in FIG. 16*b*, the light-emitting diodes 101 of the image source 1 in this embodiment are arranged according to the first distortion state. In FIG. 16b, for example, each grid in the image source 1 represents one light-emitting diode 101 or one pixel unit of the image source 1, so that a virtual image without distortion can be formed by the reflector device for displaying 30. In FIG. 16b, the grid pattern on the reflector device for displaying 30 represents a virtual image without distortion. That is to say, the light-emitting diodes 101 are arranged according to the first distortion state to at least partially or completely offset the virtual image distortion caused by the second distortion state of the reflector device for displaying 30, so that the observer can see a normal image reflected and imaged by the reflector device for displaying.

Figure 16C:
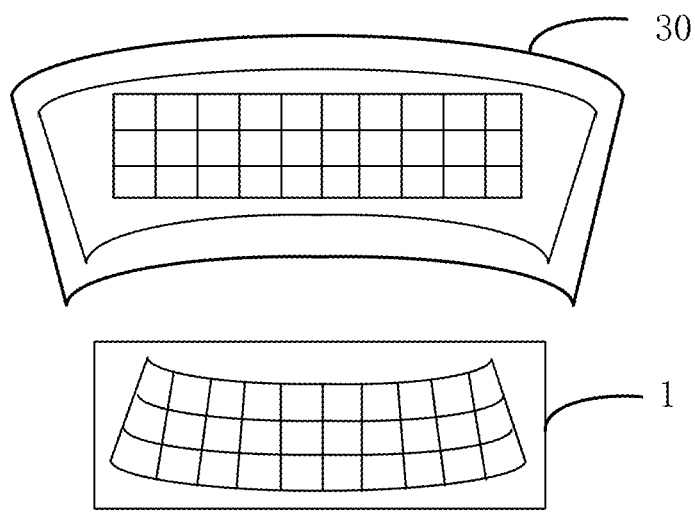
FIG. 16c is a second imaging diagram illustrating a reflective imaging of an image source with distortion elimination provided by an embodiment of the present disclosure.

Optionally, when the light-emitting diodes 101 are regularly arranged according to a normal arrangement mode, for example, according to one of the arrangement modes shown in FIGS. 11a to 15b, for example, the image emitted by the image source 1 itself is configured as an image with the first distortion state, so that a virtual image without distortion can also be formed on the reflector device for displaying 30, for example, as shown in FIG. 16c.

In this embodiment, by arranging the light-emitting diodes 101 emitting light of different colors, a monochrome or multicolor display can be realized, and monochrome or colorful HUD images can be observed. By further configuring the shape of the light-emitting diode 101, the plurality of light-emitting diodes 101 can be closely arranged, which can improve the space utilization rate, improve the image display quality and provide a good viewing experience. By arranging the light-emitting diodes 101 according to a certain arrangement mode, the imaging distortion caused by the reflector device for displaying 30 with a certain radian can be eliminated, so that the imaging of the head-up display system is more regular, and the use experience of the head-up display system is improved.

Figure 17:
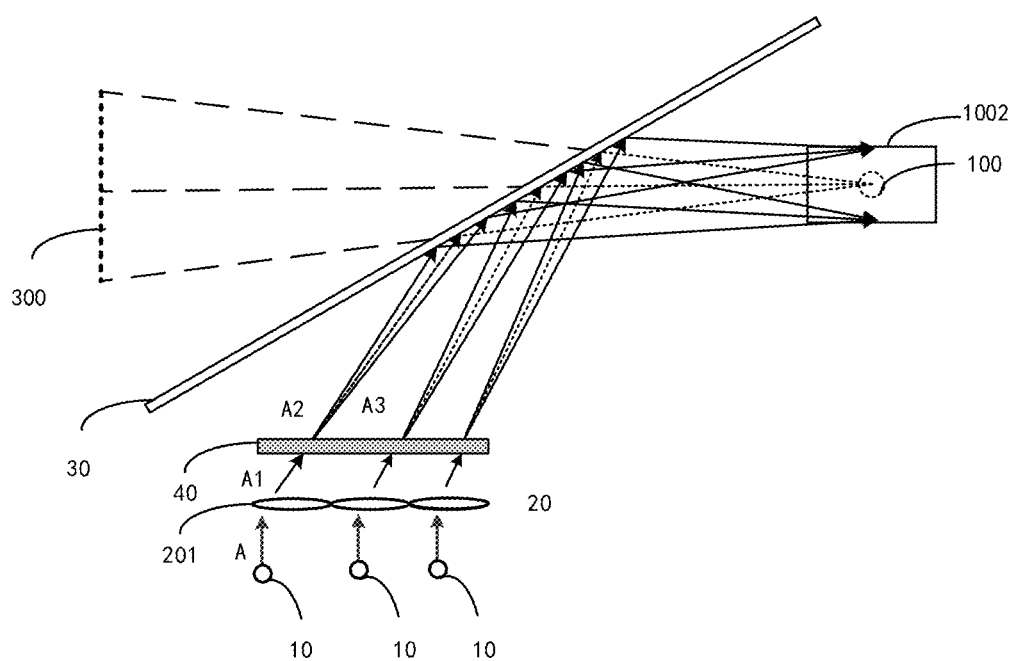
FIG. 17 illustrates a schematic structural diagram of a head-up display system provided by an embodiment of the present disclosure.
Figure 18:
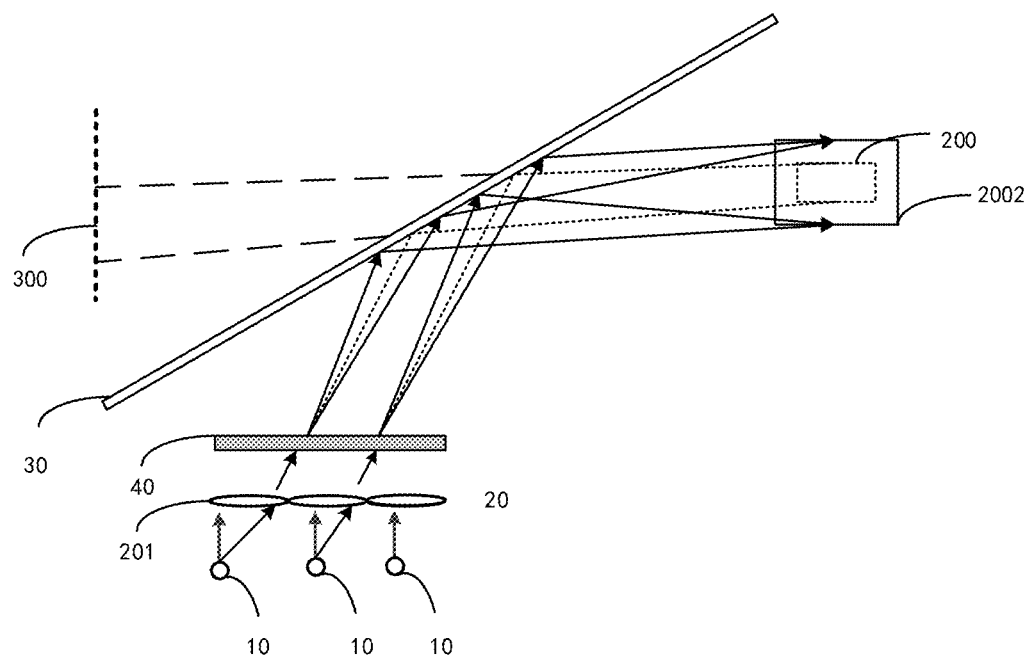
FIG. 18 illustrates a schematic structural diagram of a head-up display system provided by an embodiment of the present disclosure.

On the basis of the above embodiments of the present disclosure, the head-up display system further includes a diffuser element 40. On the basis of the above embodiments, although the micro-lens array 20 can concentrate the light emitted by a plurality of light sources 10 and emit the light to the observation region 200 after the light being reflected by the reflector device for displaying 30, since the light in the direction of chief light has greater light intensity and this part of light will be converged in the predetermined range 100, the light intensity outside the predetermined range 100 within the observation region 200 will be smaller than that in the predetermined range 100, and the brightness of light in the edge region will be relatively weak. In this embodiment, the diffuser element 40 is arranged to homogenize the brightness of the light. As shown in FIG. 17, the chief light A of light emitted by the light source 10 changes its direction to A1 after passing through the micro-lens array 20, and then the light is diffused at a predetermined diffusion angle deviating from the original chief light A1 after passing through the diffuser element 40. The A2 and A3 in the figure represent the light diffused at the predetermined diffusion angle deviating from the original chief light A1, and the diffused light is converged in a predetermined diffusion region 1002; the area of the diffusion region 1002 is larger than that of the predetermined range 100. Like the principle of light diffusion in the direction of chief light, the light emitted by the light source 10 that has a certain included angle with the direction of chief light and finally is converged in a region outside the predetermined range 100 in the observation region 200 will also be diffused at a predetermined diffusion angle deviating from the original propagation direction after passing through the diffuser element 40. Therefore, by the diffusion action of the diffuser element 40 to the light, the light will eventually be diffused and concentrated to the diffusion observation region 2002, and the light intensity in this region will be uniformly distributed after light diffusion, as shown in FIG. 18. For example, the diffuser element 40 can be a scattering optical element with low cost, such as a light homogenizer, a diffuser, etc., or the diffuser element 40 can also be a diffractive optical element (DOE) with more accurate control of diffusion effect, such as a beam shaper, etc. When passing through a scattering optical element such as the light homogenizer, light will be scattered and will be transmitted to many different angles, and also a small amount of diffraction will occur, among which the light scattering action plays a major role, resulting in a larger light spot; while the diffractive optical element mainly functions for beam expanding through diffraction by designing certain microstructures at its surface, thus the light spot is smaller and the size and shape of the light spot are controllable. It can be understood that after the light passes through the diffuser element 40, the predetermined cross-sectional shape of the diffused light beam just corresponds to the shape of the diffusion observation region 2002.

Figure 19A:
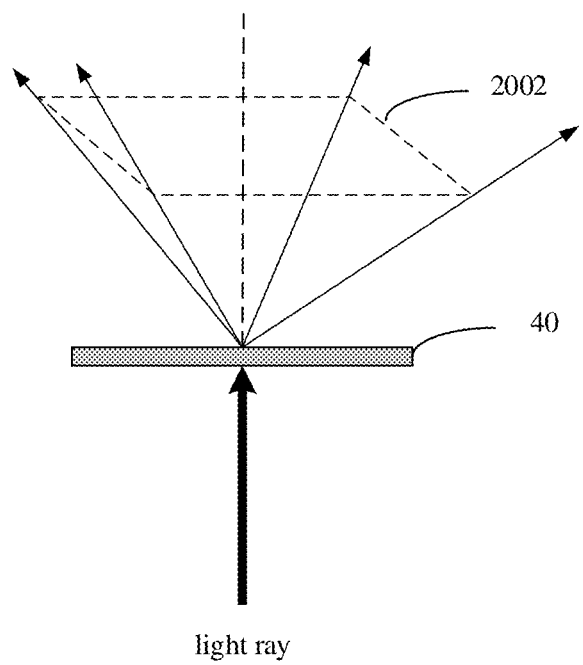
FIG. 19a is a schematic diagram illustrating the principle of diffusing light by a diffuser element provided by an embodiment of the present disclosure.

Further, the diffuser element 40 transforms the light exited from the micro-lens array 20 into a light beam with a predetermined cross-sectional shape. In this embodiment, the diffuser element 40 is, for example, a diffractive optical element, and the light beam as diffused after the light passing through the diffuser element 40 has a certain shape in its cross-section perpendicular to the propagation direction of the chief light. Optionally, the predetermined cross-sectional shape of the light beam includes but is not limited to linear, circular, elliptical, square or rectangular shape. As shown in FIG. 19a, after the light passes through a diffuser element 40 such as a diffractive optical element, the light is diffused and forms into a predetermined cross-sectional shape, and FIG. 19a illustrates the predetermined cross-sectional shape as a rectangular shape by way of example.

Figure 19B:
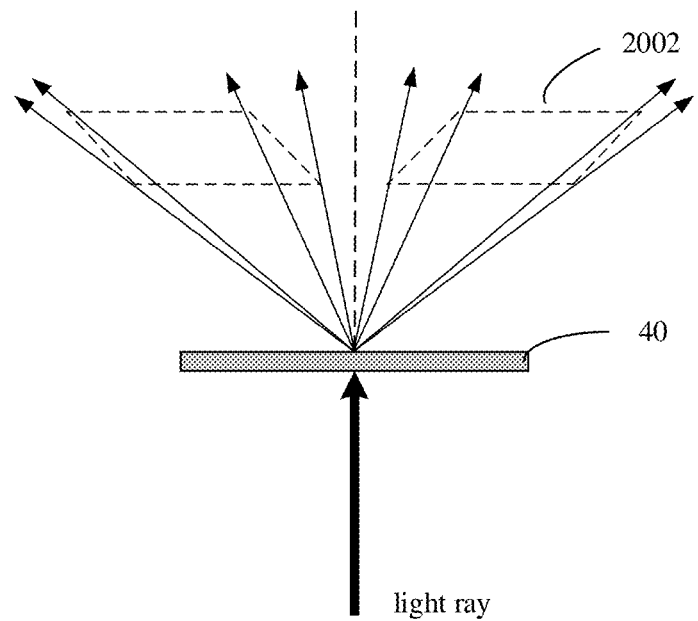
FIG. 19b is a schematic diagram illustrating the principle of diffusing light by a diffuser element provided by the embodiment of the present disclosure.

Further, for example, the diffuser element 40 is a separation-typed diffuser element, that is, for example, the diffuser element 40 diffuses the light passing there-through into a plurality of ranges, the shape of each range includes but is not limited to linear, circular, elliptical, square and rectangular shape, and for example, the shapes of these ranges after diffusion are the same or different. As shown in FIG. 19b, after passing through the separation-typed diffuser element 40, the light can be diffused into a plurality of regions, and each region corresponds to one diffusion observation region 2002; FIG. 19b illustrates the case where the light is diffused into two rectangular regions, by way of example.

In this embodiment, the head-up display system diffuses the light by the diffuser element to uniform the brightness of the light, so that the imaging brightness of the head-up display system is uniform in the observation region, and the use experience is improved.

Figure 20:
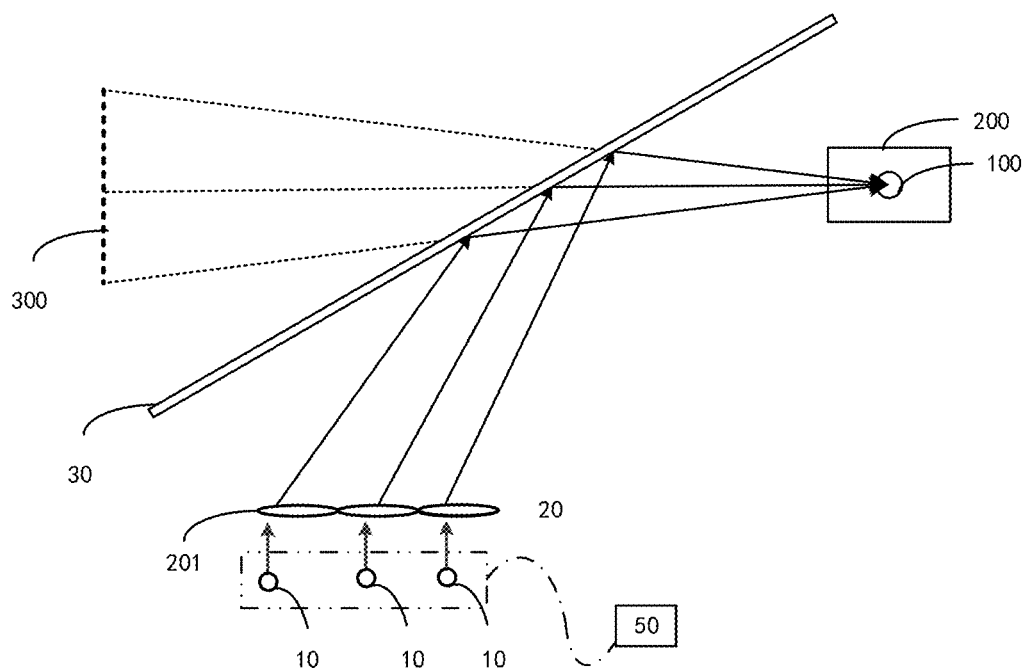
FIG. 20 illustrates a schematic structural diagram of a head-up display system provided by an embodiment of the present disclosure.

On the basis of the above embodiments of the present disclosure, the head-up display system further includes a light-emitting control unit 50 which is electrically connected with a plurality of light sources 10 and controls the light-emitting states of the plurality of light sources 10 to form an image, as shown in FIG. 20. For example, the light-emitting control unit 50 turns on the light sources 10 by transmitting digital signals, and controls the light-emitting states of the light sources 10 to form a monochrome or colored image and to emit image light. For example, the light-emitting state here can be "on" or "off" of light emission, and can also be the adjustment of illumination brightness. For example, the light-emitting state of each of the plurality of light sources 10 may be independently controlled by the light-emitting control unit 50. The light-emitting control unit 50 includes, for example, a sending end, a receiving end and a processor; the receiving end receives digital signals in a wired or wireless manner; the processor converts the digital signals into control signals for controlling the light sources 10, and then transmits the control signals through circuits such as wires by means of the electrical connection with the light sources 10, thereby controlling the light sources 10 and forming an image. In some examples, the light-emitting control unit 50 may be a light-emitting diode screen controller, the light sources 10 are light-emitting diodes, and the image can be formed by the arrangement of the light sources 10 and the on-off of the light-emitting diodes through the controller.

In this embodiment, by configuring a light-emitting control unit, the head-up display system controls the on-off state of a plurality of light sources 10, forms an image and emits image light, so that the head-up display system can display image information.

Figure 21:
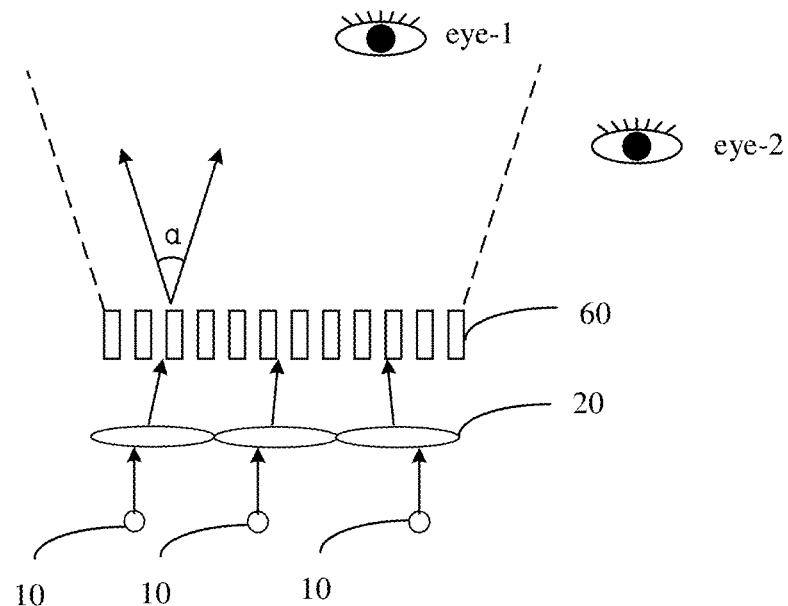
FIG. 21 illustrates a schematic structural diagram of a head-up display system provided by an embodiment of the present disclosure.

On the basis of the above embodiments of the present disclosure, the head-up display system further includes a light blocking member 60, which is disposed at a side, away from the light sources 10, of the micro-lens array 20 and limits the exit angle of the light exited from the micro-lens array 20. In this embodiment, the light blocking member 60 includes a plurality of light blocking barriers with predetermined heights, and a barrier array is formed by the plurality of raised, light blocking barriers to physically block the propagation of light in certain directions. For example, by designing the height and width of the light blocking barrier, the angle at which the observer can see the light is limited. As shown in FIG. 21, the light exited from the micro-lens array 20 are limited within an angle α by the light blocking member 60, thereby forming an observable region; that is, human eye-1 is located in the observable region and can see the image light at this time, but human eye-2 is located outside the observable region and cannot see the image light. In this embodiment, the light blocking layer 60 can be a layer of barrier array, and the barrier array can be in the horizontal direction, in the vertical direction or at any angle, so that only light in the direction parallel to the barrier can pass there-through. The viewing angle of the light blocking layer 60 is 48 degrees, 60 degrees, 75 degrees, or any other desired angles. In addition, for example, the light blocking layer 60 is an orthogonal stack of two layers of barrier arrays, or a stack of two layers of barriers which are staggered at a certain angle. For example, each layer of barrier array is in the horizontal direction, in the vertical direction or at any angle. For example, the viewing angle is 45 degrees, 60 degrees, 75 degrees, or any other desired angle. For example, the light blocking layer 60 is an anti-peeping grating.

Optionally, the light blocking member 60 further includes a light scattering layer, which can prevent from glare caused by reflection of external ambient light on the surface of the light blocking member 60 and hence avoid affecting normal driving. The light scattering layer is disposed at a side, away from the micro-lens array 20, of the light blocking member 60, and is used for scattering external ambient light. In the disclosed embodiment, by adding a light scattering layer outside the light blocking member 60, it can scatter the external ambient light such as sunlight so as to prevent from glare caused by external sunlight irradiating the surface of the light blocking member 60. For example, the light scattering layer and the light blocking layer 60 can be integrally formed, e.g., a frosted peep-proof grating.

In this embodiment, the light blocking layer 60 is added on the outer surface of the micro-lens array 20, so as to limit the exit angle of light. For example, when an image source 1 not provided with the light blocking member 60 is arranged on the surface of the console of the vehicle, the driver may see the the image source 1 and the virtual image reflected by the windshield at the same time, which may affect the driver's driving of the vehicle. The light blocking layer 60 allows the light to be emitted only towards the windshield, i.e., the image of the image source 1 itself cannot be seen from the driver's point of view; as a result, when the user drives the vehicle, it can prevent the brightness of screen of the head-up display system from influencing the user's visual field or causing dizziness to the user when forming a real image on the screen, thus improving the safety during driving. Furthermore, for example, a light scattering layer is added to avoid glare caused by the reflection of external light such as sunlight, thus further improving the driving safety.

Figure 22:
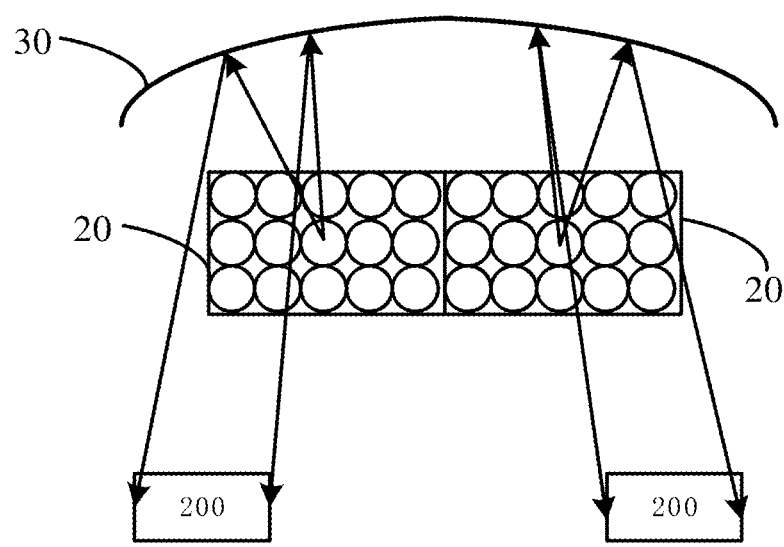
FIG. 22 illustrates a schematic structural diagram of a head-up display system provided by an embodiment of the present disclosure.

On the basis of the above embodiments of the present disclosure, the head-up display system includes a plurality of micro-lens arrays 20, each micro-lens array 20 converges the chief light of light emitted by a plurality of light sources 10 corresponding to the micro-lens array 20 to different predetermined ranges 100, different micro-lens arrays 20 emit light to the reflector device for displaying 30, the light is reflected on the surface of the reflector device for displaying, and the reflected light is incident to different observation regions 200. For example, in case of multiple observers, when a plurality of micro-lens arrays 20 is adopted, the schematic imaging diagram is shown in FIG. 22. In FIG. 22, two micro-lens arrays 20 form two observation regions 200, which can respectively correspond to different observers such as a driver and a passenger, that is, two eyeboxes. It can be understood that the plurality of light sources 10 corresponding to the two micro-lens arrays 20, respectively, can display the same or different contents, thereby realizing simultaneous observation from multiple viewing angles.

In this embodiment, by arranging a plurality of micro-lens arrays 20, and by concentrating the light from a plurality of light sources 10 corresponding to the micro-lens arrays 20 to different observation regions 200, multi-viewing angle imaging can be realized, and users with eyes in different observation regions 200 can see different or the same images at the same time, thus further improving the practicability and use experience of the head-up display system.

Figure 23:
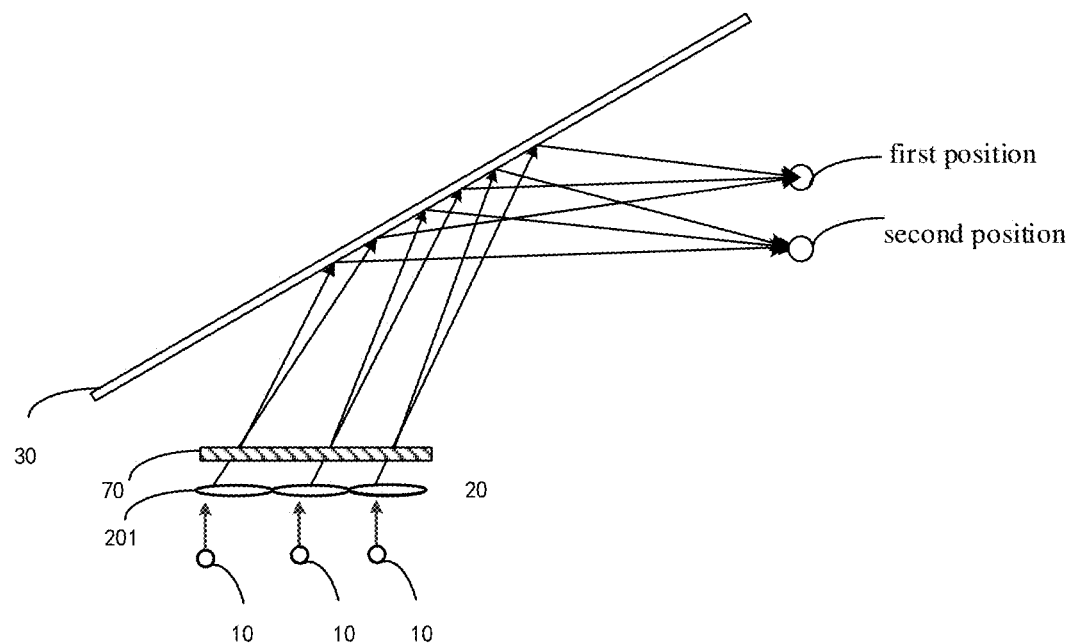
FIG. 23 illustrates a schematic structural diagram of a head-up display system provided by an embodiment of the present disclosure.

On the basis of the above embodiments of the present disclosure, the head-up display system further includes a stereoscopic vision forming layer 70, which is disposed at a side, away from the light sources 10, of the micro-lens array 20, and allows the light passing there-through to be incident to a first position and a second position, respectively, as shown in FIG. 23.

Figure 24:
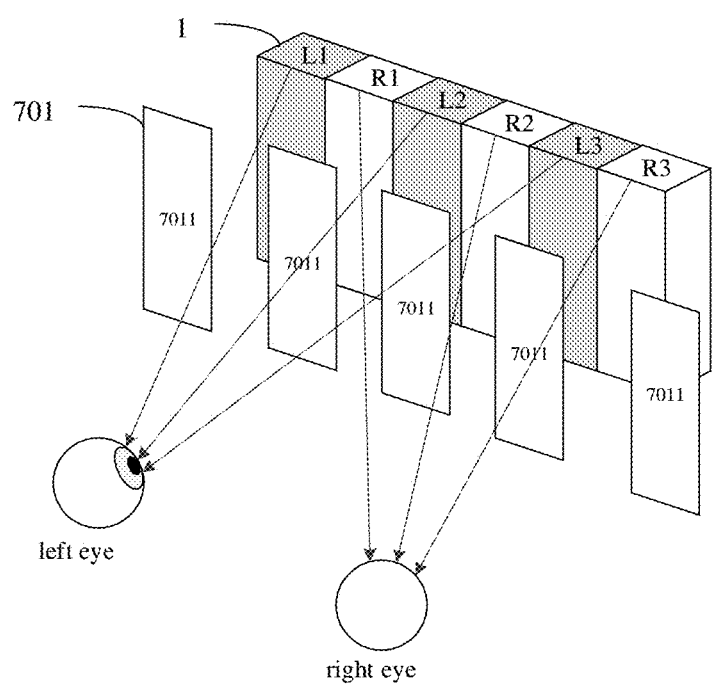
FIG. 24 illustrates a schematic structural diagram of a head-up display system provided by an embodiment of the present disclosure.

For example, the first position and the second position are positions where the user's left eye and right eye are located, respectively, and the stereoscopic vision forming layer 70 includes a barrier layer 701 including a plurality of barrier units 7011 arranged at intervals, and a predetermined distance is provided between the barrier units 7011 and the micro-lens array 20, as shown in FIG. 24. For convenience of description, in both of FIGS. 24 and 25, the image source 1 is used and explained instead of the micro-lens array 20 and the plurality of light sources 10. In FIG. 24, by way of example, it is illustrated that the image source 1 corresponds to six pixel units and the barrier layer 701 includes five barrier units 7011, then each pixel unit includes light emitted by at least one light source 10. As shown in the figures, because there is a gap between the barrier layer 701 and the image source 1, the barrier layer 701 can block the light, so the light emitted by some pixel units (R1, R2, R3) corresponding to the image source 1 cannot reach the left eye position, and hence the left eye can only see the light emitted by the pixel units L1, L2 and L3; likewise, the right eye can only see the light emitted by the pixel units R1, R2 and R3. Therefore, the barrier layer 701 can divide the pixel units corresponding to the image source 1 into two parts, so that the light emitted by some pixel units, such as pixel units L1, L2 and L3, can only reach the left eye position, while the light emitted by some other pixel units, such as pixel units R1, R2 and R3, can only reach the right eye position. Two kinds of images with optical parallax are displayed through different pixel units corresponding to the image source 1, so that there is optical parallax between the image viewed by the left eye and the image viewed by the right eye, thereby realizing stereoscopic vision imaging. The size of each barrier unit 7011 in the barrier layer 701 and the relative positions between the barrier units 7011 are specially designed upon precise calculation, so that the imaging can be performed at certain positions. In this way, the observer can watch stereoscopic images without wearing special eyeglasses, but the observer needs to be at a certain position to obtain better 3D imaging effect.

Optionally, the barrier unit 7011 of the barrier layer 701 includes liquid crystals or gratings; for example, when the barrier unit 7011 includes liquid crystals, the switching between 2D image display and stereoscopic vision image display are realized by controlling the working state of the liquid crystals. For example, when an observer needs to watch a 2D image, the liquid crystals in the barrier layer 701 present an arrangement state so as not to form the barrier units, then the pixel units display 2D image normally. When the observer needs to watch a stereoscopic vision image, the liquid crystals of the barrier layer 701 form barrier units, then the pixel units display images with optical parallax, so that the observer can watch the stereoscopic vision image at a certain position.

Figure 25:
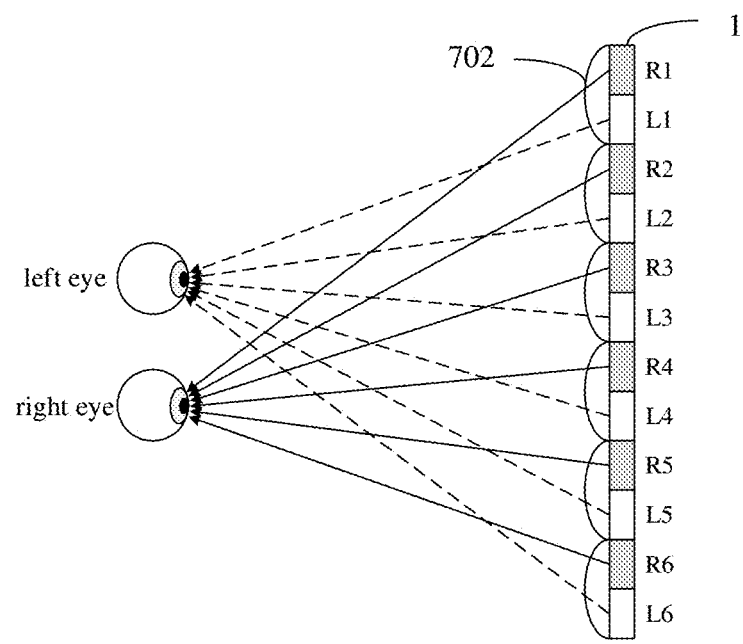
FIG. 25 illustrates a schematic structural diagram of a head-up display system provided by an embodiment of the present disclosure.

Alternatively, the first position and the second position are the positions of user's left eye and right eye, respectively, and the stereoscopic vision forming layer 70 includes a light splitting lens layer 702 which includes a plurality of light splitting lenses, and for example, the light splitting lenses are specifically cylindrical lenses. For example, as shown in FIG. 25, the light splitting lens layer 702 includes a plurality of vertically arranged cylindrical lenses, and each cylindrical lens at least covers pixel units in two different columns of the image source 1; the cylindrical lens is configured to converge the light emitted by one column of pixel units to a first position and converge the light emitted by another column of pixel units to a second position, so that the stereoscopic vision imaging can be realized. In FIG. 25, the image source 1 corresponds to twelve columns of pixel units, and the light splitting lens layer 702 contains six cylindrical lenses, each cylindrical lens covers two columns of pixel units, as shown in FIG. 25, the uppermost cylindrical lens covers the pixel units R1 and L1. Based on the refractive characteristics of the cylindrical lens, by configuring the curved surface of the cylindrical lens, the light emitted by one column of pixel units can be incident to the first position after passing through the cylindrical lens, for example, the light emitted by the pixel unit R1 is incident to the right eye position; Also, the light emitted by another column of pixel units passes through the cylindrical lens and then is incident to the second position, for example, the light emitted by the pixel unit L1 is incident to the left eye position. For example, by accurately configuring the shape of the cylindrical lens, the light emitted by some pixel units is incident to a certain position, and the light emitted by some other pixel units can be incident to another position. That is, as shown in FIG. 25, the light emitted by the pixel units R1, R2, R3, R4, R5, R6, etc. can be converged in the right eye position, and the light emitted by the pixel units L1, L2, L3, L4, L5, L6, etc. can be converged in the left eye position, thereby enabling the observer to view stereoscopic vision images at certain positions. For example, the cylindrical lens in this embodiment may be an optical cylindrical lens, and may also be a liquid crystal cylindrical lens.

In this embodiment, by providing the stereoscopic vision forming layer 70, stereoscopic vision display can be realized, and users with eyes in the first position and the second position can see stereoscopic vision images, which further improves the practicability and use experience of the head-up display system.

Figure 26:
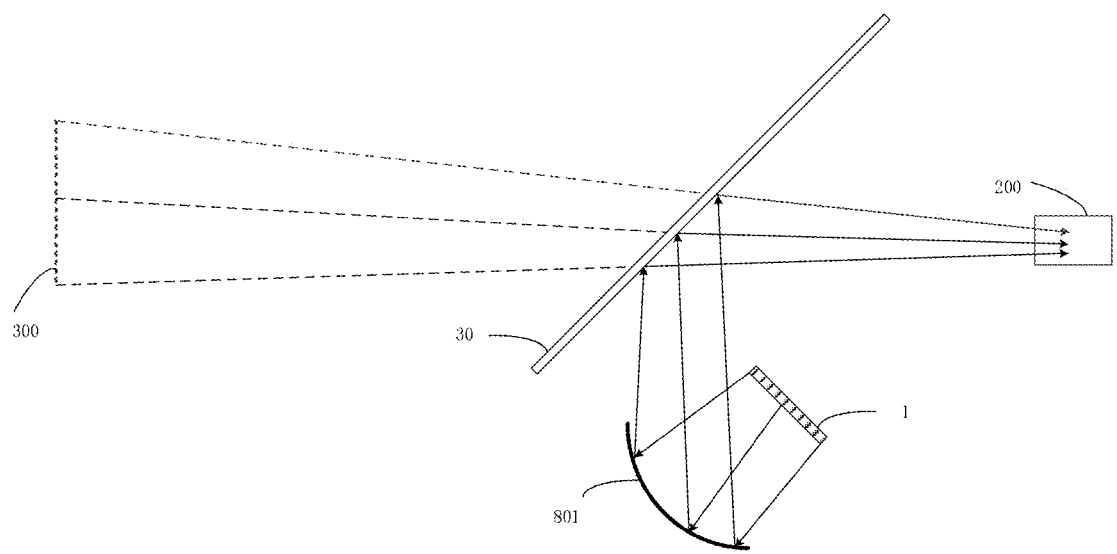
FIG. 26 illustrates a schematic structural diagram of a head-up display system provided by an embodiment of the present disclosure.
Figure 27:
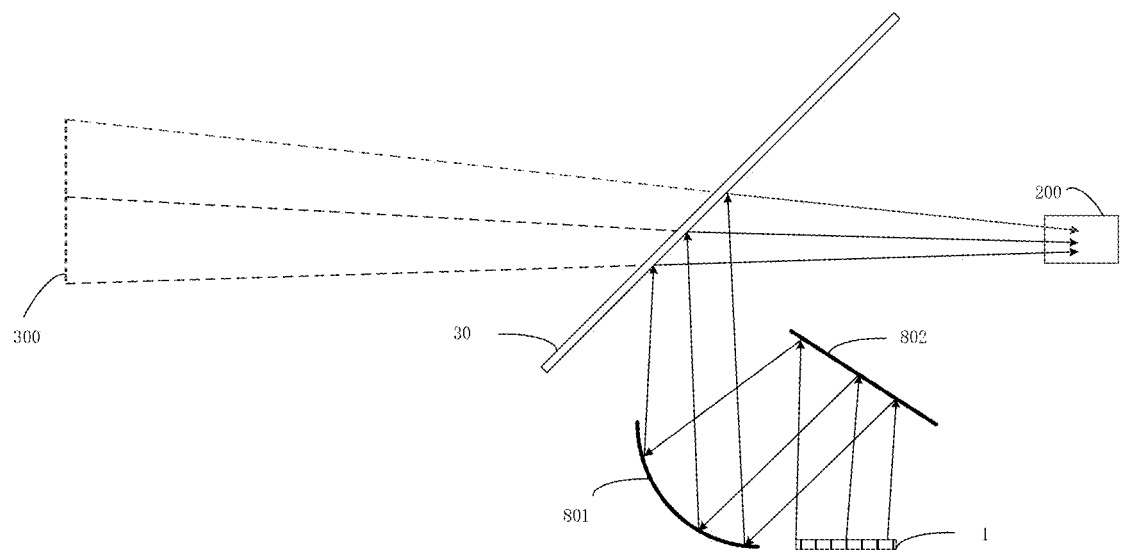
FIG. 27 illustrates a schematic structural diagram of a head-up display system provided by an embodiment of the present disclosure.

On the basis of the above embodiments of the present disclosure, the head-up display system further includes at least one reflector element 80; the reflector element 80 is disposed between the micro-lens array 20 and the reflector device for displaying 30, and includes at least one of a curved reflector element 801 and a planar reflector element 802. For example, when the reflector element 80 is disposed between the micro-lens array 20 and the reflector device for displaying 30, it means that the reflector element 80 is disposed on the optical path of the image light exited from the micro-lens array 20. For convenience of explanation, in FIGS. 26 and 27, the image source 1 is used instead of the micro-lens array 20 and the light sources 10. For example, the reflector element 80 can be a curved reflector element 801. For example, by providing the curved reflector element 801, the imaging distance of the virtual image of the head-up display system is increased, and also the curved reflector element 801 can also enlarge the image to a certain extent, as shown in FIG. 26. The reflector element 80 also includes a planar reflector element 802, and the addition of the planar reflector element 802 can fold the optical path, reduce the volume of the head-up display system and increase the applicability of the devices, as shown in FIG. 27. Further, for example, the curved reflector element 801 is a free form mirror, and the planar reflector element 802 can be a planar aluminum mirror or a planar dielectric film mirror, which is not limited in this embodiment.

In this embodiment, the reflector element 80 reflects light to the reflector device for displaying 30, and the concaved reflective surface of the curved reflector element 801 can enlarge the imaging area of the image source 1, so that the head-up display system can generate a larger-sized virtual image even if the image source 1 has a smaller size. The planar reflector element 802 can further reduce the volume of the head-up display system, which is convenient for installation and usage of the head-up display system.

In the above technical solutions provided by the embodiments of the present disclosure, a plurality of light sources and micro-lens arrays are arranged, the chief light of light emitted by the plurality of light sources is converged in a predetermined range through the micro-lens arrays, and the concentrated light is incident to the reflector device for displaying and reflected on the surface of the reflector device for displaying to form an image; for example, the light with a certain divergence angle emitted by the light sources is oriented to the same direction, so that the utilization rate and brightness of the light emitted by the light sources is improved. Under the same requirement of brightness, the head-up display system provided by this embodiment can form a high-brightness image with less power consumption, thereby reducing the power consumption.

Figure 28:
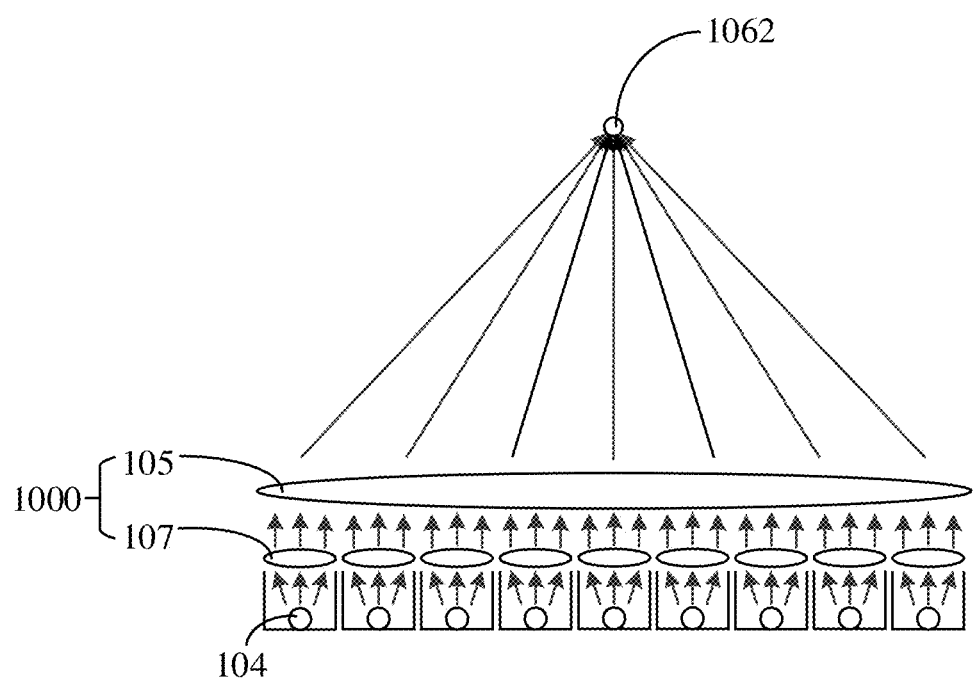
FIG. 28 illustrates a schematic structural diagram of an active light-emitting image source provided by an embodiment of the present disclosure.

This embodiment provides an active light-emitting image source, as shown in FIG. 28, which includes a light controller device 1000 and a plurality of light sources 104; the plurality of light sources 104 are distributed and arranged at different positions; the light controller device 1000 includes a collimating element 107. The collimating element 107 covers one or more light sources 104, and is used for collimating the light emitted by the covered light sources 104 and emitting the collimated light. The active light-emitting image source also includes a light concentrating element 105. The light concentrating element 105 is disposed at a side, away from the light sources 104, of the collimating element 107, and is used for converging all the light emitted by the light sources 104 to the same position, i.e., the predetermined position 1062 in FIG. 28. For example, as shown in FIG. 28, the light concentrating element 105 is correspondingly provided with a plurality of collimating elements 107. For example, the predetermined position 1062 can be a predetermined range, and the chief light of the light passing through the light concentrating element 105 is directed to the predetermined range.

In this embodiment, the collimating element 107 is used for adjusting the emitting directions of light to be within a predetermined angle range. FIG. 28 illustrates the case where one light source is provided with one collimating element 107 by way of example. The light source 104 can be, for example, an LED, and one collimating element 107 is disposed on the surface of each LED to collimate the diffused light emitted by the LED, so that most of the light emitted by the LED is directed to the same direction.

Optionally, the collimating element 107 can be a collimating lens or a collimating film; the collimating lens includes one or more selected from the group consisting of convex lens, Fresnel lens and lens combination (such as the combination of convex lens and concave lens, the combination of Fresnel lens and concave lens, etc.). For example, the collimating element 107 can be a convex lens, then the light source 104 can be arranged at the "focal length" of the convex lens, that is, the distance between the convex lens and the light source is the focal length of the convex lens, so that the light in different directions emitted by the light source 104 can be exited in parallel after passing through the collimating element 107. Alternatively, the collimating element 107 can be a collimating film, such as a brightness enhancement film (BEF), which is used for adjusting the emitting directions of light to be within a predetermined angle range, for example, concentrating the light to be within an angle range of −35° to +35° degrees deviating from the normal line of the collimating film.

For example, the light source 104 is specifically an electroluminescent device such as a light-emitting diode (LED), an incandescent lamp, a laser, a quantum dot light source, etc., for example, organic light-emitting diode (OLED), Mini LED, Micro LED, cold cathode fluorescent lamp (CCFL), electroluminescent display (ELD), cold LED light (CLL), electroluminescence (EL), field emission display (FED), tungsten halogen lamp, metal halide lamp, etc.

According to the active light-emitting image source provided by this embodiment, the light emitted by the light source is collimated by the collimating element, so that the scattered light emitted by the light source can be uniformly oriented to the same direction; in this way, it prevents the light source from emitting scattered light. In addition, the light exited from the collimating element is converged by an optical converging element, thereby improving the brightness of the light emitted by the light source. Compared with the traditional active light-emitting image source, given the same brightness requirement, the active light-emitting image source provided in this embodiment can guarantee sufficient brightness at lower power, and hence can reduce the power consumption.

Figure 29:
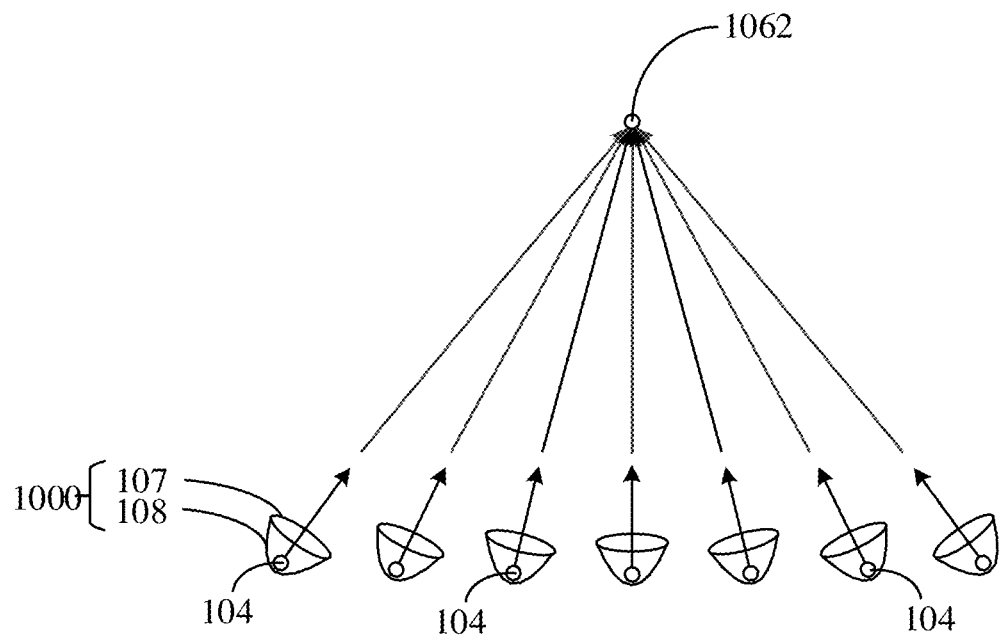
FIG. 29 illustrates a schematic structural diagram of an active light-emitting image source provided by an embodiment of the present disclosure.

Optionally, in order to realize light convergence, the light of the light source can be converged by adjusting the orientation of the chief light of each light source, in addition to using the light concentrating element 105. As shown in FIG. 29, the light controller device 1000 further includes a direction controller element 108; the direction controller element 108 corresponds to one or more light sources 104, and is used for adjusting the orientations of chief light of the corresponding light sources 104 and for converging the light emitted by the corresponding light sources 104 at different positions; as shown in FIG. 29, the light emitted by the light source 104 is converged in a predetermined position 1062.

In this embodiment, the light emitted by the light sources 104 is converged by a plurality of direction controller elements 108. For example, as shown in FIG. 29, light sources 104 are arranged at different positions, and seven light sources 104 are illustrated by way of example; accordingly, seven direction controller elements 108 are provided to control the directions of light emitted by the light sources 104. As shown in FIG. 29, the direction controller elements 108 converge the light emitted by a plurality of light sources 104 to a predetermined position 1062. In FIG. 29, the predetermined position 1062 is illustrated as a point position by way of example, but the predetermined position 1062 in this embodiment can also be a small region, as long as the light emitted by the light source 104 can be converged in this region. For example, the directions of light emitted by the light sources 104 are adjusted by configuring the orientations of the direction controller elements 108 at different positions, that is, the orientations of the chief light of the light sources are adjusted so as to realize light convergence.

Figure 30:
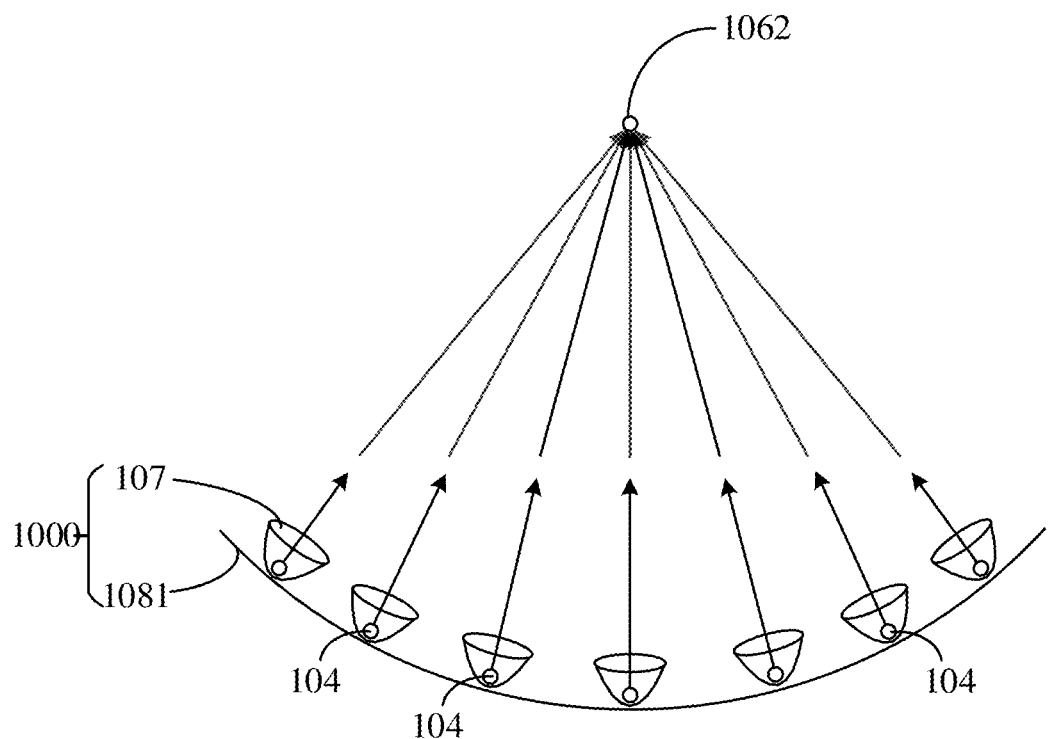
FIG. 30 illustrates a schematic structural diagram of an active light-emitting image source provided by an embodiment of the present disclosure.

Optionally, as shown in FIG. 30, the direction controller element is a concaved substrate 1081, and the light sources 104 are arranged on the concaved surface of the substrate 1081, and the plane where the light sources 104 are located is tangent to the concaved surface of the substrate 1081. By configuring the shape of the substrate 1081, the directions of chief light of the light sources 104 can also be adjusted, thereby realizing light convergence.

Figure 31:
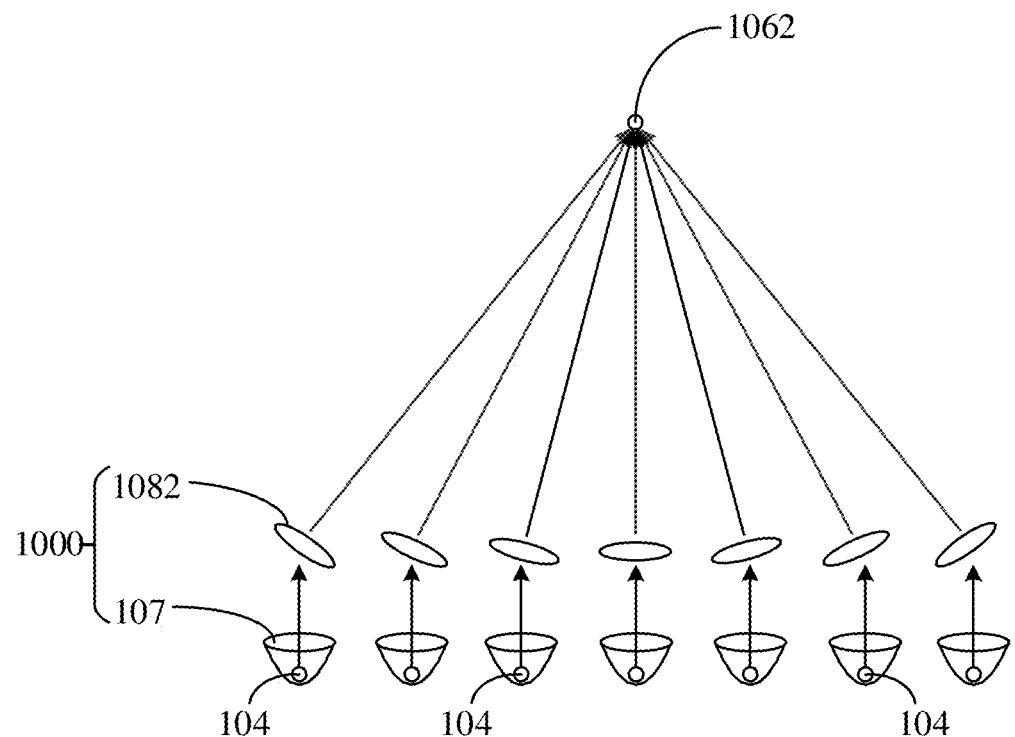
FIG. 31 illustrates a schematic structural diagram of an active light-emitting image source provided by an embodiment of the present disclosure.

Optionally, as shown in FIG. 31, the direction controller element 108 is a lens 1082 with an inclination angle, and the chief light of the lens 1082 is orientated to the predetermined position 1062. The adjustment of the chief light of the light source 104 is realized by the orientation of the lens 1082.

Figure 32:
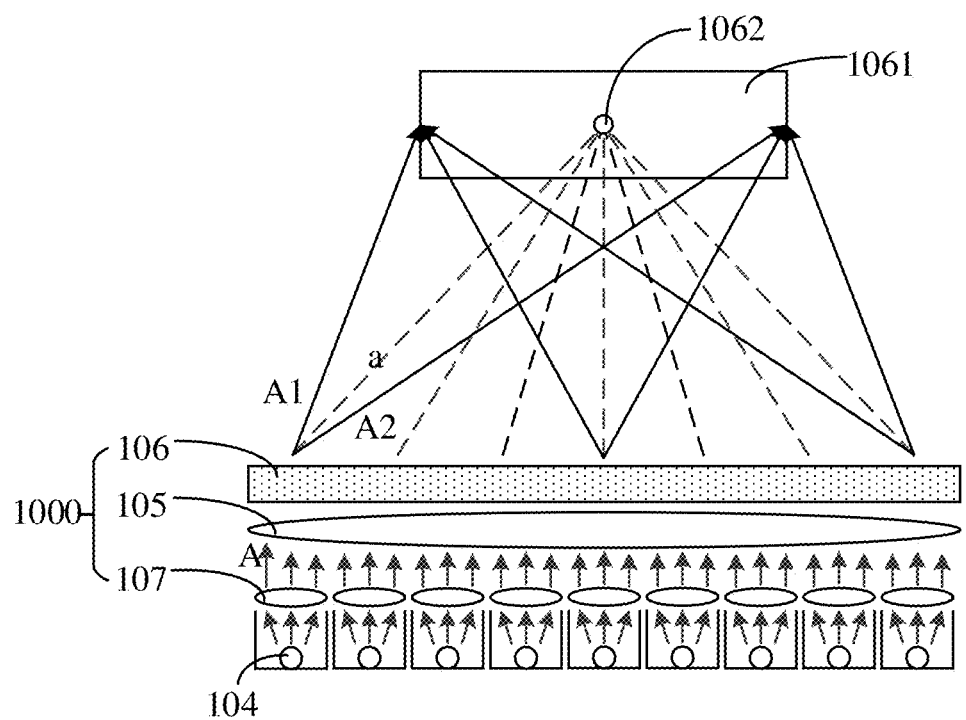
FIG. 32 illustrates a schematic structural diagram of an active light-emitting image source provided by an embodiment of the present disclosure.
Figure 33:
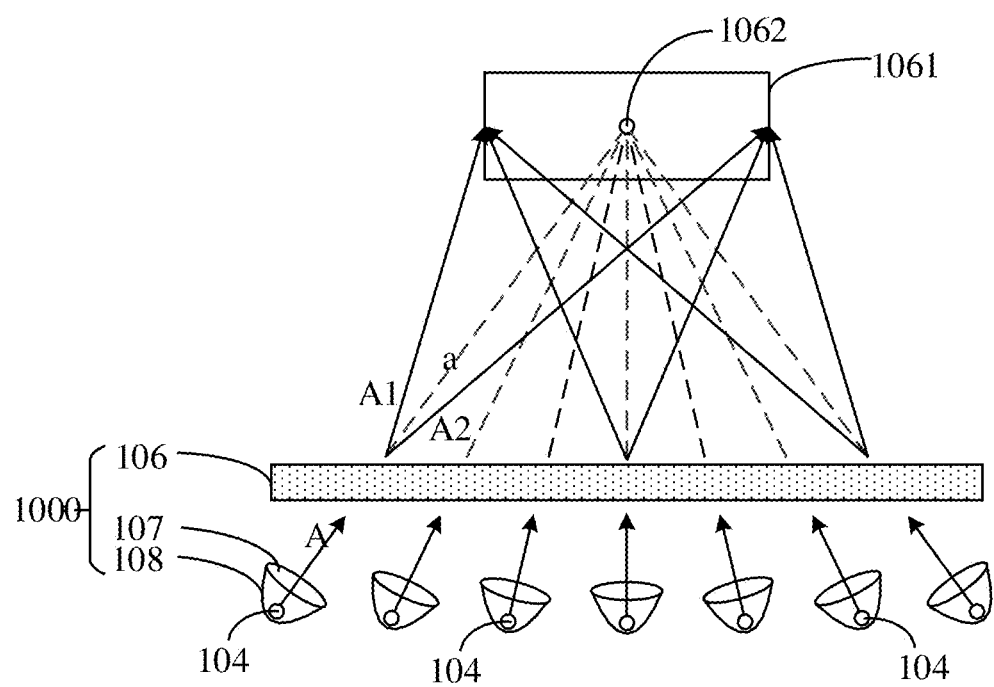
FIG. 33 illustrates a schematic structural diagram of an active light-emitting image source provided by an embodiment of the present disclosure.

On the basis of the above embodiments, when the light concentrating element 105 or the direction controller element 108 is utilized to achieve light convergence, the active light-emitting image source has high imaging brightness, but the imaging area is small and the viewing range is narrow, which is not suitable for multiple users to watch at the same time. In this embodiment, the light controller device 100 further includes a diffuser element 106. As shown in FIG. 32 or FIG. 33, the diffuser element 106 is disposed at a side, away from the light sources 104, of the light concentrating element 105 or disposed at a side, away from the light sources 104, of the direction controller element 108, and the diffuser element 106 is used for diffusing the light emitted by the light sources 104 and forming a light spot 1061.

Referring to FIG. 33, by way of example, in this embodiment, the light emitted by the light sources 104 is converged by a plurality of direction controller elements 108. For example, as shown in FIG. 33, light sources 104 are arranged at different positions, and seven light sources 104 are illustrated in FIG. 33 by way of example. Accordingly, seven direction controller elements 108 are provided to control the directions of light emitted by the light sources 104. As shown in FIG. 33, when the diffuser element 106 is not provided, the direction controller element 108 converges the light emitted by a plurality of light sources 104 to a predetermined position 1062. In FIG. 33, the predetermined position 1062 is illustrated as a point position by way of example, but the predetermined position 1062 in this embodiment can also be a small region, as long as the light emitted by the light sources 104 is converged in this region. For example, the directions of light emitted by the light sources 104 are adjusted by configuring the orientations of the direction controller elements 108 at different positions so as to realize light convergence.

Also, if the light from different positions is only converged in the predetermined position 1062 in a small range, the active light-emitting image source can only be imaged in a small range, which is inconvenient for the observer to watch the image formed by the image source. In this embodiment, the light is diffused by the diffuser element 106, and a light spot 1061 with a predetermined shape and a larger imaging range is formed, which is convenient for the observer to watch the imaging of the image source in a large range. For example, taking the leftmost, direction controller element 108 in FIG. 33 as an example, as shown in FIG. 33, when the diffuser element 106 is not provided, the light A emitted by the leftmost light source 104 can be incident to the predetermined position 1062 along the optical path a; when the diffuser element 106 is disposed outside the direction controller element 108, the diffuser element 106 diffuses the light A into a plurality of light beams (including light beams A1, A2, etc.), and diffuses the plurality of light beams into a range, i.e., the light spot 1061, so that the observer can conveniently view the imaging of the active light-emitting image source within the range of the light spot 1061.

Optionally, the diffuser element 106 includes, but is not limited to, a diffractive optical element (DOE), such as a beam shaper. After passing through the diffractive optical element, the light will be diffused and forms a light spot with a certain geometric shape. The size and shape of the light spot are determined by the microstructure of the diffractive optical element. The shape of the light spot includes but is not limited to round, oval, square, rectangle and bat wing shape. For example, the diffusion angle of the light spot after diffusion in the side view direction is 10 degrees, preferably 5 degrees; for example, the diffusion angle in the frontal direction is 50 degrees, preferably 30 degrees.

For example, a plurality of direction controller elements 108 are provided, and different direction controller elements 108 are arranged at different positions for adjusting the emitting directions of light emitted by light sources at different positions, and the emitting directions of the light emitted by light sources at different positions are all directed to the same predetermined position. As shown in FIG. 33, the number of direction controller elements 108 in FIG. 33 is seven. One direction controller element 108 can adjust the light emitted by one light source 104 or adjust the light emitted by a plurality of light sources 104, which is not limited in this embodiment.

It can be understood by those skilled in the art that FIG. 33 is only a schematic illustration of the diffusing action of the diffuser element 106, which can diffuse the light into the range of the light spot 1061 instead of completely limiting the light emitted by the light source 104 within the light spot 1061. That is, the light A may form a light spot with larger range after passing through the diffuser element 106, and the light emitted by other light sources 104 may form other light spots after passing through the diffuser element 106, but the light emitted by all the light sources 104 can reach the light spot 1061.

According to the active light-emitting image source provided in this embodiment, light at different positions is converged in the same position through the direction controller elements, so that the brightness of light can be improved; Also, the light is diffused by the diffuser element, so that a light spot with a predetermined shape can be formed, which is convenient for subsequent imaging in the range of the light spot, thereby improving the brightness of the light and also expanding the imaging range.

On the basis of the above embodiments, the direction controller element 108 is used for adjusting the emitting direction of the light emitted by one or more light sources 104.

A point (x, y, z) on the plane where the direction controller element 108 is located satisfies the following equation:

$$(x_p-x_0)(x-x_0)+(y_p-y_0)(y-y_0)+(z_p-z_0)(z-z_0)=0;$$

wherein $x_p$, $y_p$, $z_p$ respectively represent the coordinates of x-axis, y-axis and z-axis of the predetermined position 1062, and $x_0$, $y_0$, $z_0$ respectively represent the coordinates of x-axis, y-axis and z-axis of a known point on the plane where the direction controller element 108 is located.

In this embodiment, the plane where the direction controller element 108 is located refers to the arrangement plane of the plurality of light sources 104 when the direction controller element 108 is used for adjusting the exiting direction of the light emitted by the plurality of light sources 104. That is, the exiting direction of the light is perpendicular to the plane where the direction controller element 108 is located. If the predetermined position 1062 to which the light is directed is set as point P, its coordinates are $(x_p, y_p, z_p)$; while the coordinates of a known point $M_0$ on the plane where the direction controller element 108 is located are $(x_0, y_0, z_0)$, the vector corresponding to the emitting direction of the light is expressed as:

$$\overrightarrow{M_0P}=(x_0-x_p, y_0-y_p, z_0-z_p).$$

$\overrightarrow{M_0P}$ is the normal vector of the plane where the direction controller element 108 is located, and $(x_0, y_0, z_0)$ is a point on the plane. According to the equation through dot method, the point (x, y, z) on the plane where the direction controller element 108 is located satisfies the following equation:

$$(x_p-x_0)(x-x_0)+(y_p-y_0)(y-y_0)+(z_p-z_0)(z-z_0)=0.$$

Also, in order to ensure the convergence effect of the active light-emitting image source, the size of the direction controller element 108 needs to be as small as possible, and for example, the size of the direction controller element 108 is specifically determined according to actual requirements.

The point (x, y, z) on the plane where the direction controller element 108 is located satisfies the following value ranges:

$$\begin{cases} x_1 \le x \le x_2 \\ y_1 \le y \le y_2; \\ z_1 \le z \le z_2 \end{cases}$$

wherein $x_1$, $x_2$, $y_1$, $y_2$, $Z_1$, $Z_2$ are the values determined according to the position of each direction controller element 108, and the values of $x_1$, $x_2$, $y_1$, $y_2$, $Z_1$, $Z_2$ corresponding to different direction controller elements 108 are not completely the same.

Alternatively, the point (x, y, $Z$) on the plane where the direction controller element 108 is located satisfies the following value ranges:

$$\begin{cases} x_0 - \Delta x_1 \le x \le x_0 + \Delta x_2 \\ y_0 - \Delta y_1 \le y \le y_0 + \Delta y_2; \\ z_0 - \Delta z_1 \le z \le z_0 + \Delta z_2 \end{cases}$$

wherein $\Delta x_1$, $\Delta x_2$, $\Delta y_1$, $\Delta y_2$, $\Delta Z_1$, $\Delta Z_2$ are values determined based on the size of the direction controller element 108.

On the basis of the above embodiments, the light controller device 1000 further includes a light blocking member; the light blocking member is disposed at the outermost side of the light controller device, for example, disposed at one side of the diffuser element 106 away from the light sources 104, and is used for limiting the angle of emergence of the light emitted by the active light-emitting image source. The light blocking member here can be as same as the light blocking member in the above embodiments, without repeating the repetition here.

On the basis of the above embodiments, the direction controller element 108 further includes a reflector element; the reflector element includes a lamp cup; the lamp cup is a hollow shell surrounded by reflective surfaces, and the opening direction of the lamp cup is oriented to the collimating element 107; a tail end of the lamp cup away from the opening is used for installing the light source 104.

In addition, the active light-emitting image source according to this embodiment may also include a stereoscopic vision forming layer as described in the above embodiments, for example, the stereoscopic vision forming layer may be disposed at the light-emitting side of the light controller device 1000. For the description of the stereovision vision forming layer, reference can be made to the above embodiments, without repeating the repetition here. For example, the appearance and arrangement of the light source 104 in the active light-emitting image source in this embodiment can be the same as that of the light-emitting diode 101 in the above embodiment, without repeating the repetition here. According to other embodiments of the present disclosure, there is also provided a head-up display, the image source of the head-up display is any active light-emitting image source in the above embodiments. Furthermore, in addition to the active light-emitting image source, for example, the head-up display also includes a reflector element 80 and a reflector device for displaying 30 as shown in FIG. 27, and the corresponding arrangement may also refer to FIG. 27 and the related descriptions, without repeating the repetition here.

According to some embodiments of the present disclosure, there is also provided an active light-emitting image source, including: a light source array including a plurality of light sources arranged in an array; a light controller device configured to converge chief light of light emitted by the plurality of light sources so that chief light of light after being exited from the micro-lens array is directed to a predetermined range; and a diffuser element disposed at a light-emitting side of the light controller device, light exited from the light controller device is diffused after passing through the diffuser element so as to convert the light exited from the light controller device into a light beam with a predetermined cross-sectional shape. For example, the "light controller device" here may refer to either the micro-lens array 20 or the light controller device 1000 in the above embodiments. An embodiment according to the present disclosure also provides a head-up display including such active light-emitting image source, and the head-up display may be disposed at the light-emitting side of the diffuser element so that the light exited from the diffuser element is incident to an observation region.

According to some other embodiments of the present disclosure, there is also provided a motor vehicle including the head-up display system, the head-up display or the active light-emitting image source described in any of the above embodiments.

In addition, it is to be noted that the active light-emitting image source described according to FIGS. 28-34 can also be applied to the head-up display system in the aforementioned embodiments.

Based on the above embodiments, the present disclosure also provides the following technical solutions:

(1) A head-up display, including: an active light-emitting image source; the active light-emitting image source includes an image source substrate and a plurality of light sources, and all the light sources are arranged on the image source substrate and on the same side of the image source substrate; the appearance of the light source is in a round shape, and the plurality of light sources are closely stacked and arranged; or, the appearance of the light source is in a rectangular shape, and the plurality of light sources are completely closely stacked and arranged; or, the appearance of the light source is in a hexagonal shape, and the plurality of light sources are completely closely stacked and arranged; or, the appearance of the light source is in an octagonal shape, and the plurality of light sources are closely stacked and arranged; or, the appearance of the light sources is in a round shape or in an octagonal shape, the plurality of light sources are closely stacked and arranged, and sub-light sources with sizes matched with gaps between every four light sources are additionally arranged in the gaps; or, the plurality of light sources are arranged according to a first distortion state, and the first distortion state is in an opposite and corresponding relationship with a second distortion state of the windshield.

(2) A head-up display according to (1), wherein the active light-emitting image source includes a light controller device and a plurality of light sources; the plurality of light sources are distributed and arranged at different positions; the light controller device includes a collimating element and a light concentrating element; the collimating element covers one or more light sources and is used for collimating the light emitted by the covered light sources and emitting the collimated light; the light concentrating element is disposed at a side, away from the light sources, of the collimating element, and is used for converging the light emitted by all the light sources.

(3) A head-up display according to (2), wherein the light controller device further includes a direction controller element; the direction controller element corresponds to one or more light sources and is used for adjusting the orientations of chief light of the corresponding light sources and converging the light emitted by the corresponding light sources at different positions.

(4) A head-up display according to (3), wherein a plurality of direction controller elements is provided, and different direction controller elements are arranged at different positions for adjusting exiting directions of light emitted by light sources at different positions, and the exiting directions of light emitted by light sources at different positions are all directed to the same predetermined position.

(5) A head-up display according to (3), wherein the direction controller element is used for adjusting the emitting directions of light emitted by one or more light sources; a point $(x, y, z)$ on the plane where the direction controller element is located satisfies the following equation:

$$(x_p-x_0)(x-x_0)+(y_p-y_0)(y-y_0)+(z_p-z_0)(z-z_0)=0;$$

wherein $x_p, y_p, z_p$ respectively represent the coordinates of x-axis, y-axis and z-axis of the predetermined position, and $x_0, y_0, z_0$ respectively represent the coordinates of x-axis, y-axis and z-axis of a known point on the plane where the direction controller element is located.

(6) A head-up display according to (3), wherein the direction controller element is a concaved substrate, the light sources are arranged on the concaved surface of the substrate, and the plane where the light sources are located is tangent to the concaved surface of the substrate; or, the direction controller element is a lens with an inclination angle, and the chief light of the lens is oriented to the predetermined position.

(7) A head-up display according to (3), wherein the direction controller element further includes a reflector element; the reflector element includes a lamp cup; the light cup is a hollow shell surrounded by reflective surfaces, and the opening direction of the light cup is oriented to the collimating element; a tail end of the lamp cup away from the opening is used for installing the light source.

(8) A head-up display according to any one of (2) to (7), wherein the light controller device further includes a diffuser element; the diffuser element is disposed at a side, away from the light sources, of the light concentrating element or disposed at a side, away from the light sources, of the direction controller element, and is used for diffusing the light emitted by the light sources and forming a light spot.

(9) A head-up display according to (2), wherein the active light-emitting image source further includes a barrier layer disposed at a side, away from the light sources, of the collimating element, and a predetermined distance is provided between the barrier layer and the collimating element; the barrier layer includes a plurality of barrier units arranged at intervals.

(10) A head-up display according to (9), wherein the barrier units include liquid crystals; or, the barrier layer include an integrated liquid crystal, and the plurality of barrier units arranged at intervals are formed by controlling a working state of the liquid crystal units of the integral liquid crystal.

(11) A head-up display according to (2), wherein the active light-emitting image source further includes a cylindrical lens layer disposed at a side, away from the light sources, of the collimating element; the cylindrical lens layer includes a plurality of vertically arranged cylindrical lenses, and each cylindrical lens covers at least two light sources in different columns; and the cylindrical lens is used for allowing the light emitted by one column of light sources to be incident to a first position and allowing the light emitted by another column of light sources to be incident to a second position.

(12) A head-up display according to any one of (2) to (11), wherein the light controller device further includes a light blocking member; the light blocking member is disposed at the outermost side of the light controller device, and is used for limiting an exit angle of light exited from the head-up display.

(13) A head-up display according to (12), wherein the light blocking member includes a plurality of light blocking barriers with predetermined heights, and a height direction of the light blocking barriers is oriented to the windshield.

(14) A head-up display according to (1), further including a reflective mirror and a curved mirror; the curved mirror is provided with a concaved reflecting surface; the reflective mirror is disposed on an exiting path of light emitted by the active light-emitting image source, and is used for reflecting the light emitted by the active light-emitting image source to the curved mirror; and the curved mirror is used for reflecting the light exited from the reflective mirror to an imaging region.

As above are merely exemplary embodiments of the present disclosure. It should be noted that, several modifications and improvements may be made by those skilled in the art without departing from the principle(s) of the present disclosure, and these modifications and improvements fall within the protection scope of the present disclosure.

What is claimed is:

1. A head-up display system, comprising:
a plurality of light sources arranged according to a predetermined rule;
a micro-lens array comprising a plurality of micro-lenses, wherein each micro-lens of the plurality of micro-lenses corresponds to one or more light sources and is configured to adjust a direction of chief light of light emitted by the one or more light sources corresponding to the each micro-lens; and
a reflector device for displaying arranged at a side, away from the plurality of light sources, of the micro-lens array, wherein the light emitted by the plurality of light sources is incident on the reflector device for displaying after passing through the micro-lens array and is reflected on a surface of the reflector device for displaying, and then reflected light is incident into an observation region,
the micro-lens array is configured to concentrate chief light of light emitted by the plurality of light sources in such a manner that:
an extension line of chief light of light directly exited from the micro-lens array is directed to a first predetermined range;
chief light of the reflected light is directed to a second predetermined range, wherein
the first predetermined range is located within a mirrored position of the observation region relative to the reflector device for displaying, and the second predetermined range is located within the observation region, wherein the micro-lens is a condenser micro-lens, the condenser micro-lens comprises a first cylindrical lens, and the first cylindrical lens is correspondingly arranged in a light-emitting direction of the plurality of light sources arranged along a first direction, a plane where the chief light of the plurality of light sources arranged along the first direction is located is a first plane, and a main axis of the first cylindrical lens is parallel with the first plane but does not coincide with the first plane.

2. The head-up display system as claimed in claim 1, wherein at least part of the plurality of light sources are configured to be independently controlled to emit light so as to form image light.

3. The head-up display system as claimed in claim 1, wherein an area of the second predetermined range is smaller than an area of the observation region, and/or, wherein the predetermined rule comprises that, the plurality of light sources are arranged along a first direction and a second direction, and the first direction is different from the second direction.

4. The head-up display system as claimed in claim 1, wherein the condenser micro-lens further comprises a second cylindrical lens, the second cylindrical lens is between the first cylindrical lens and the reflector device for displaying, and a main axis of the second cylindrical lens is perpendicular to a main axis of the first cylindrical lens.

5. The head-up display system as claimed in claim 1, wherein the plurality of light sources comprise at least one selected from the group consisting of a red light-emitting diode, a green light-emitting diode and a blue light-emitting diode.

6. The head-up display system as claimed in claim 5, wherein an appearance of the light-emitting diode and an arrangement of a plurality of light-emitting diodes adopt at least one selected from the group consisting of the following:

the appearance of the light-emitting diode is in a round shape, and the plurality of light-emitting diodes are closely arranged;

the appearance of the light-emitting diode is in a triangular shape, and the plurality of light-emitting diodes are closely arranged;

the appearance of the light-emitting diode is in a rectangular shape, and the plurality of light-emitting diodes are closely arranged;

the appearance of the light-emitting diode is in a hexagonal shape, and the plurality of light-emitting diodes are closely arranged;

the appearance of the light-emitting diode is in an octagonal shape, and the plurality of light-emitting diodes are closely arranged;

the appearance of the light-emitting diode is in a round shape or an octagonal shape, the plurality of light-emitting diodes are closely arranged, and a light-emitting diode having a size matched with a size of a gap between every four light-emitting diodes is additionally arranged in the gap; and the plurality of light-emitting diodes are arranged according to a first distortion state, and the first distortion state is opposite and corresponding to a second distortion state of the reflector device for displaying.

7. The head-up display system as claimed in claim 1, wherein the head-up display system further comprises a diffuser element;

the diffuser element is at a side, away from the plurality of light sources, of the micro-lens array, the light exited from the micro-lens array is diffused after passing through the diffuser element, and diffused light is incident on the reflector device for displaying, and/or, wherein the head-up display system further comprises a light blocking member;

the light blocking member is at a side, away from the plurality of light sources, of the micro-lens array, and is configured to limit an exit angle of the light exited from the micro-lens array, and/or, wherein the head-up display system further comprises a stereoscopic vision forming layer at a side, away from the plurality of light sources, of the micro-lens array, and the stereoscopic vision forming layer is configured to allow light passing through the stereoscopic vision forming layer to be incident to a first position and a second position, respectively, and/or, wherein the head-up display system further comprises at least one reflector element;

the at least one reflector element is between the micro-lens array and the reflector device for displaying;

the at least one reflector element comprises at least one selected from the group consisting of a curved reflector element and a planar reflector element.

8. The head-up display system as claimed in claim 7, wherein the diffuser element comprises at least one selected from the group consisting of a diffractive optical element and a scattering optical element, and/or, wherein the diffuser element is configured to convert the light exited from the micro-lens array into a light beam with a predetermined cross-sectional shape.

9. The head-up display system as claimed in claim 7, wherein the stereoscopic vision forming layer comprises: a plurality of barrier units arranged at intervals;

a predetermined distance is between the barrier unit and the micro-lens array, or, wherein the stereoscopic vision forming layer comprises a light splitting lens layer;

the light splitting lens layer comprises a plurality of light splitting lenses.

10. The head-up display system as claimed in claim 1, wherein the head-up display system further comprises a light-emitting control unit;

the light-emitting control unit is electrically connected with the plurality of light sources, respectively, and is configured to control a light-emitting state of the plurality of light sources to form image light.

11. The head-up display system as claimed in claim 1, wherein the head-up display system comprises a plurality of micro-lens arrays;

each micro-lens array of the plurality of micro-lens arrays is configured to concentrate chief light of light emitted by the plurality of light sources corresponding to the each micro-lens array, so that chief light of light exited from the plurality of micro-lens arrays is directed to different predetermined ranges;

the light exited from the plurality of micro-lens arrays is incident on the reflector device for displaying and is reflected on the surface of the reflector device for displaying, and the reflected light is incident into different observation regions, and/or, wherein main axes of at least two micro-lenses of the plurality of micro-lenses are different from each other, so that the chief light of light exited from the micro-lens array is finally directed to the second predetermined range after being reflected by the reflector device for displaying.

12. The head-up display system as claimed in claim 1, wherein the plurality of light sources are excited by an electric field to generate light.

13. A motor vehicle, comprising the head-up display system as claimed in claim 1.

14. A head-up display, comprising:

an active light-emitting image source, comprising:

a light source array comprising a plurality of light sources arranged in an array;

a light controller device configured to concentrate chief light of light emitted by the plurality of light sources; and a diffuser element at a light exit side of the light controller device, and the light exited from the light controller device is diffused after passing through the diffuser element, so as to convert the light exited from the light controller device into a light beam with a predetermined cross-sectional shape; and a reflector device for displaying at a light exit side of the diffuser element to allow light exited from the diffuser element to be incident into an observation region, wherein an extension line of chief light of light directly exited from the light controller device is directed to a first predetermined range;

chief light of light exited from the reflector device for displaying is directed to a second predetermined range, wherein the first predetermined range is located within a mirrored position of the observation region relative to the reflector device for displaying, and the second predetermined range is located within the observation region, wherein the micro-lens is a condenser micro-lens, the condenser micro-lens comprises a first cylindrical lens, and the first cylindrical lens is correspondingly arranged in a light-emitting direction of the plurality of light sources arranged along a first direction, a plane where the chief light of the plurality of light sources arranged along the first direction is located is a first plane, and a main axis of the first cylindrical lens is parallel with the first plane but does not coincide with the first plane.

* * * * *